United States Patent
Kuno et al.

(10) Patent No.: US 8,604,383 B2
(45) Date of Patent: Dec. 10, 2013

(54) LASER PROCESSING METHOD

(75) Inventors: Koji Kuno, Hamamatsu (JP); Tatsuya Suzuki, Hamamatsu (JP); Takeshi Sakamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 1648 days.

(21) Appl. No.: 11/659,376

(22) PCT Filed: Jul. 27, 2005

(86) PCT No.: PCT/JP2005/013746
§ 371 (c)(1),
(2), (4) Date: Jul. 31, 2007

(87) PCT Pub. No.: WO2006/013763
PCT Pub. Date: Feb. 9, 2006

(65) Prior Publication Data
US 2008/0035611 A1    Feb. 14, 2008

(30) Foreign Application Priority Data

Aug. 6, 2004    (JP) ............................. P2004-231555

(51) Int. Cl.
*B23K 26/42*    (2006.01)
*H01L 21/301*    (2006.01)

(52) U.S. Cl.
USPC ..................................... 219/121.69; 438/463

(58) Field of Classification Search
USPC ............. 219/121.69, 121.72, 121.61, 121.62; 438/463, 460, 795
See application file for complete search history.

(56) References Cited

U.S. PATENT DOCUMENTS

| | | | |
|---|---|---|---|
| 4,546,231 A | | 10/1985 | Gresser et al. |
| 5,266,511 A | * | 11/1993 | Takao ........................... 438/401 |
| 5,916,460 A | * | 6/1999 | Imoto et al. .............. 219/121.67 |
| 6,992,026 B2 | | 1/2006 | Fukuyo et al. |
| 7,396,742 B2 | | 7/2008 | Fukuyo et al. |
| 7,489,454 B2 | | 2/2009 | Fukuyo et al. |

(Continued)

FOREIGN PATENT DOCUMENTS

| | | |
|---|---|---|
| CN | 1160228 A | 9/1997 |
| CN | 1473087 | 2/2004 |

(Continued)

OTHER PUBLICATIONS

Machine translation of Japan Patent No. 2004-001,076, Nov. 2011.*

(Continued)

*Primary Examiner* — Geoffrey S Evans
(74) *Attorney, Agent, or Firm* — Drinker Biddle & Reath LLP

(57) ABSTRACT

This laser processing method irradiates a substrate 4 with laser light L while locating a light-converging point P within the substrate 4, so as to form a quality modified region 71 to become a starting point region for cutting within the substrate 4 along a line to cut 5. Here, the laser light L is oscillated pulsewise along a desirable part RP in the line to cut 5, and continuously in a predetermined part RC in the line to cut 5. Consequently, the quality modified region 71 is formed within the substrate 4 along the desirable part RP in the line to cut 5, whereas no quality modified region 71 is formed within the substrate 4 along the predetermined part RC in the line to cut 5.

14 Claims, 24 Drawing Sheets

(56) References Cited

U.S. PATENT DOCUMENTS

| | | | |
|---|---|---|---|
| 7,547,613 B2 | 6/2009 | Fukuyo et al. | |
| 7,566,635 B2 | 7/2009 | Fujii et al. | |
| 7,592,237 B2 | 9/2009 | Sakamoto et al. | |
| 7,592,238 B2 | 9/2009 | Fukuyo et al. | |
| 7,605,344 B2 | 10/2009 | Fukumitsu | |
| 7,608,214 B2 | 10/2009 | Kuno et al. | |
| 7,615,721 B2 | 11/2009 | Fukuyo et al. | |
| 7,626,137 B2 | 12/2009 | Fukuyo et al. | |
| 7,709,767 B2 | 5/2010 | Sakamoto | |
| 7,718,510 B2 | 5/2010 | Sakamoto et al. | |
| 7,719,017 B2 | 5/2010 | Tanaka | |
| 7,732,730 B2 | 6/2010 | Fukuyo et al. | |
| 7,749,867 B2 | 7/2010 | Fukuyo et al. | |
| 7,754,583 B2 | 7/2010 | Sakamoto | |
| 7,825,350 B2 | 11/2010 | Fukuyo et al. | |
| 7,897,487 B2 | 3/2011 | Sugiura et al. | |
| 7,902,636 B2 | 3/2011 | Sugiura et al. | |
| 7,939,430 B2 | 5/2011 | Sakamoto et al. | |
| 7,947,574 B2 | 5/2011 | Sakamoto et al. | |
| 2003/0216009 A1* | 11/2003 | Matsuura et al. | 438/460 |
| 2004/0002199 A1* | 1/2004 | Fukuyo et al. | 438/463 |
| 2005/0009307 A1* | 1/2005 | Shigematsu et al. | 438/487 |
| 2005/0155956 A1 | 7/2005 | Hamada et al. | |
| 2005/0202596 A1 | 9/2005 | Fukuyo et al. | |
| 2005/0202650 A1* | 9/2005 | Imori et al. | 438/462 |
| 2005/0272223 A1 | 12/2005 | Fujii et al. | |
| 2006/0046435 A1* | 3/2006 | Kida | 438/460 |
| 2006/0144828 A1 | 7/2006 | Fukumitsu et al. | |
| 2006/0148212 A1 | 7/2006 | Fukuyo et al. | |
| 2006/0255024 A1 | 11/2006 | Fukuyo et al. | |
| 2007/0085099 A1 | 4/2007 | Fukumitsu et al. | |
| 2007/0125757 A1 | 6/2007 | Fukuyo et al. | |
| 2007/0158314 A1 | 7/2007 | Fukumitsu et al. | |
| 2007/0252154 A1 | 11/2007 | Uchiyama et al. | |
| 2008/0037003 A1 | 2/2008 | Atsumi et al. | |
| 2008/0090382 A1 | 4/2008 | Fujii et al. | |
| 2008/0218735 A1 | 9/2008 | Atsumi et al. | |
| 2008/0251506 A1 | 10/2008 | Atsumi et al. | |
| 2009/0008373 A1 | 1/2009 | Muramatsu et al. | |
| 2009/0032509 A1 | 2/2009 | Kuno et al. | |
| 2009/0098713 A1 | 4/2009 | Sakamoto | |
| 2009/0107967 A1 | 4/2009 | Sakamoto et al. | |
| 2009/0117712 A1 | 5/2009 | Sakamoto et al. | |
| 2009/0166342 A1 | 7/2009 | Kuno et al. | |
| 2009/0166808 A1 | 7/2009 | Sakamoto et al. | |
| 2009/0250446 A1 | 10/2009 | Sakamoto | |
| 2009/0261083 A1 | 10/2009 | Osajima et al. | |
| 2009/0302428 A1 | 12/2009 | Sakamoto et al. | |
| 2010/0006548 A1 | 1/2010 | Atsumi et al. | |
| 2010/0009547 A1 | 1/2010 | Sakamoto | |
| 2010/0012632 A1 | 1/2010 | Sakamoto | |
| 2010/0012633 A1 | 1/2010 | Atsumi et al. | |
| 2010/0015783 A1 | 1/2010 | Fukuyo et al. | |
| 2010/0025386 A1 | 2/2010 | Kuno et al. | |
| 2010/0032418 A1 | 2/2010 | Kuno et al. | |
| 2010/0055876 A1 | 3/2010 | Fukuyo et al. | |
| 2010/0151202 A1 | 6/2010 | Fukumitsu | |
| 2010/0176100 A1 | 7/2010 | Fukuyo et al. | |
| 2010/0184271 A1 | 7/2010 | Sugiura et al. | |
| 2010/0200550 A1 | 8/2010 | Kumagai | |
| 2010/0203678 A1 | 8/2010 | Fukumitsu et al. | |
| 2010/0203707 A1 | 8/2010 | Fujii et al. | |
| 2010/0227453 A1 | 9/2010 | Sakamoto | |
| 2010/0240159 A1 | 9/2010 | Kumagai et al. | |
| 2010/0258539 A1 | 10/2010 | Sakamoto | |
| 2010/0301521 A1 | 12/2010 | Uchiyama | |
| 2010/0311313 A1 | 12/2010 | Uchiyama | |
| 2010/0327416 A1 | 12/2010 | Fukumitsu | |
| 2011/0000897 A1 | 1/2011 | Nakano et al. | |
| 2011/0001220 A1 | 1/2011 | Sugiura et al. | |
| 2011/0021004 A1 | 1/2011 | Fukuyo et al. | |
| 2011/0027971 A1 | 2/2011 | Fukuyo et al. | |
| 2011/0027972 A1 | 2/2011 | Fukuyo et al. | |
| 2011/0037149 A1 | 2/2011 | Fukuyo et al. | |
| 2011/0274128 A1 | 11/2011 | Fukumitsu et al. | |

FOREIGN PATENT DOCUMENTS

| | | | |
|---|---|---|---|
| EP | 1 338 371 | | 8/2003 |
| EP | 1338371 A | * | 8/2003 |
| JP | 59-212185 | | 12/1984 |
| JP | 61-123489 | | 6/1986 |
| JP | 08-019888 A | | 1/1996 |
| JP | 02/22301 | | 3/2002 |
| JP | 2002-192370 | | 7/2002 |
| JP | 2003-334675 | | 11/2003 |
| JP | 2004-001076 A | * | 1/2004 |
| JP | 2004-106009 | | 4/2004 |
| JP | 2004-106009 A | * | 4/2004 |
| JP | 2004-111601 | | 4/2004 |
| JP | 2004-165227 | | 6/2004 |
| JP | 2004-186340 A | * | 7/2004 |
| JP | 4200177 | | 10/2008 |
| WO | WO 98/55035 | | 12/1998 |
| WO | 02/22301 | | 3/2002 |
| WO | WO 2004/020140 | | 3/2004 |

OTHER PUBLICATIONS

T. Miyazaki et al., "Oscillation Waveform," Sangyotosho Kabushikigaisha, May 31, 1991, p. 9 (with partial translation).

A. Kobayashi, "Comparison of normal output laser light with Q switch laser light," Kaihatsusha, Aug. 10, 1976, pp. 47-48 (with partial translation).

K. Hayashi; "Inner Glass Marking by Harmonics of Solid-State Laser", Proceedings of $45^{th}$ Laser Materials Processing Conference, Dec. 1998, pp. 23-28.

K. Miura et al., "Formation of Photo-Induced Structures in Glasses with Femtosecond Laser", Proceedings of $42^{nd}$ Laser Materials Processing Conference, Nov. 1997, pp. 105-111.

T. Sano et al., "Evaluation of Processing Characteristics of Silicon with Picosecond Pulse Laser", Preprints of the National Meeting of Japan Welding Society, No. 66, Apr. 2000, pp. 72-73 (with at least partial English translation).

U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.

X. Liu et al., "Laser Ablation and Micromachining with Ultrashort Laser Pulses," IEEE Journal of Quantum Electronics, vol. 33, No. 10, Oct. 1997, pp. 1706-1716.

* cited by examiner

*Fig.18*
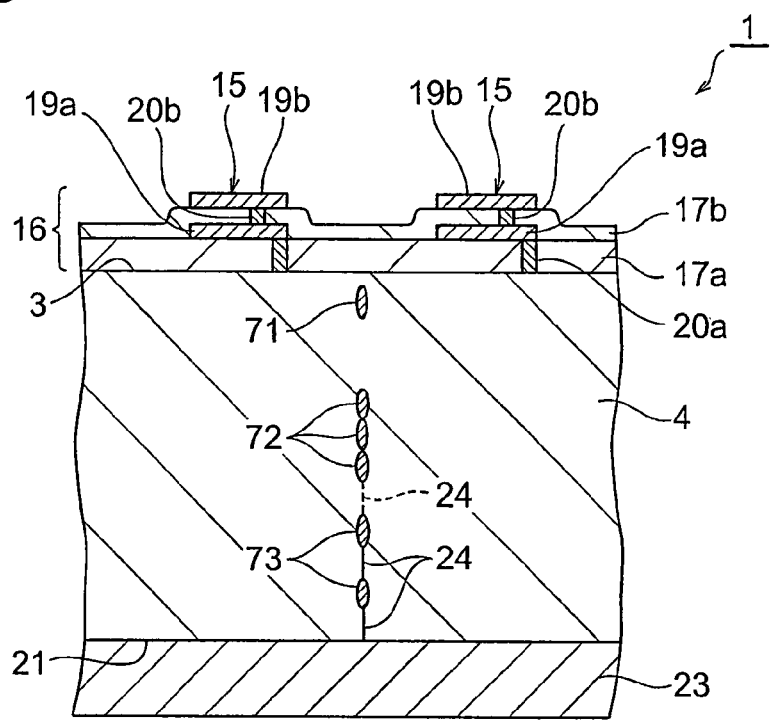
(a)
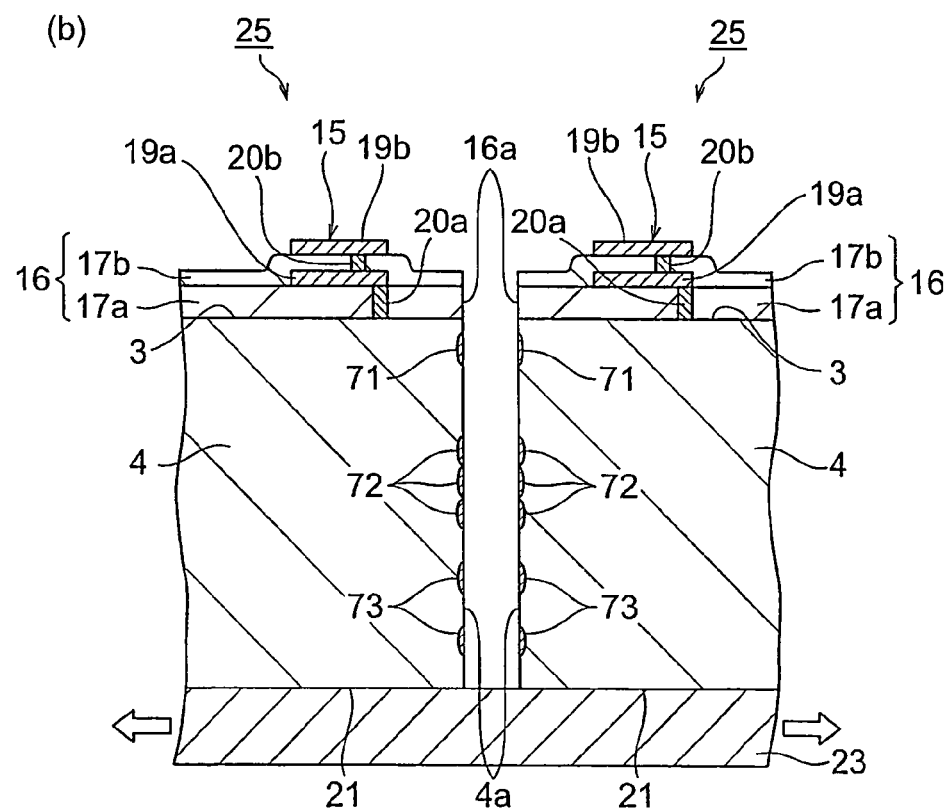
(b)

LASER PROCESSING METHOD

TECHNICAL FIELD

The present invention relates to a laser processing method used for cutting an object to be processed, and a semiconductor apparatus manufactured by using the same.

BACKGROUND ART

Known is a laser processing method which, when cutting an object to be processed upon irradiation with laser light, irradiates the object with the laser light while switching between continuous oscillation and pulse oscillation (see, for example, Patent Document 1). This laser processing method oscillates the laser light continuously in linear parts in lines to cut, and pulsewise in curved or corner parts in the lines to cut.
Patent Document 1: Japanese Patent Application Laid-Open No. SHO 59-212185

DISCLOSURE OF THE INVENTION

Problem to be Solved by the Invention

Known on the other hand is a laser processing method which irradiates a planar object to be processed with laser light while locating a light-converging point within the object, so as to form a modified region to become a starting point region for cutting within the object along a line to cut the object. Such a laser processing method has been desired to reliably form the modified region within a desirable part in the line to cut.

In view of such circumstances, it is an object of the present invention to provide a laser processing method which can reliably form a modified region within an object to be processed along a desirable part in a line to cut, and a semiconductor apparatus manufactured by using the same.

Means for Solving Problem

For solving the above-mentioned problem, in one aspect, the present invention provides a laser processing method of irradiating a planar object to be processed with laser light while locating a light-converging point within the object so as to form a modified region to become a starting point region for cutting within the object along a line to cut the object, the method selectively switching between continuous oscillation and pulse oscillation when irradiating the object with the laser light.

Oscillating the laser light pulsewise can form a modified region within the object more reliably than with the case where the laser light is continuously oscillated. Therefore, oscillating the laser light pulsewise along a desirable part in the line to cut and continuously in the part other than the desirable part can reliably form a modified region within the object along the desirable part. Especially when a Q-switched laser is used, the Q-switch is under ON-control by control of RF-output such that the pulsed oscillation and the continuous oscillation are switched therebetween, so an application state of LD light for exciting to a solid state laser crystal does not change basically. Therefore, the pulsed oscillation and the continuous oscillation can be speedily switched therebetween, so processing can be performed with the stable laser light and speed for processing can be gathered. When the continuous oscillation output and the pulsed oscillation output are mixed during the continuous oscillation by a type of a laser oscillator, average output of pulsed output is low, so the energy does not go over a threshold for processing, and the modified region is not formed within the object in the part other than a desirable part. In this case, the pulsed oscillation and the continuous oscillation can be speedily switched therebetween and heat stability can progress when the pulsed oscillation is switched, so processing can be performed with the stable laser light and speed for processing can be gathered. The continuous oscillation in the present invention includes this case.

Preferably, the object is a substrate having a front face formed with a laminate part, whereas the modified region is formed within the substrate. In this case, oscillating the laser light pulsewise along a desirable part in the line to cut and continuously in the part other than the desirable part can reliably form a modified region within the substrate along the desirable part.

Preferably, the modified region is formed at a position where a distance between the front face and an end part on the front face side of the modified region is 5 µm to 20 µm. Preferably, the modified region is formed at a position where the distance between the front face and an end part on the rear face side of the modified region is [5+(substrate thickness)×0.1] µm to [20+(substrate thickness)×0.1] µm. Here, the "distance" refers to the distance along the thickness direction of the substrate unless otherwise specified.

For example, when an expandable film such as an expandable tape is attached to the rear face of the substrate and expanded in the case mentioned above, the substrate and laminated part are cut along the line to cut. When the modified region is formed at any of the positions mentioned above, the laminate part can be cut with a high precision.

When the laminate part includes a metal film or insulating film along a predetermined part in the line to cut, it will be preferred if the laser light is continuously oscillated in the predetermined part. Damages imparted to the laminate part can be made smaller in this case than in the case where the laser light is oscillated pulsewise along the predetermined part. This can improve the accuracy in cutting the laminate part in the predetermined part in the line to cut when cutting the substrate and laminate part.

Preferably, the laser light is oscillated pulsewise in a part where lines to cut intersect. This reliably forms the modified region within the object along the part where the lines to cut intersect. As a consequence, the accuracy in cutting the object can improve in the part where the lines to cut intersect.

Preferably, the object is cut along the line to cut after forming the modified region. This can cut the object with a high precision along the line to cut.

In another aspect, the present invention provides a semiconductor apparatus manufactured by using the laser processing method mentioned above. This semiconductor apparatus has a cut section cut with a high precision.

Effect of the Invention

The present invention can reliably form a modified region within an object to be processed along a desirable part in a line to cut.

BRIEF DESCRIPTION OF THE DRAWINGS

FIG. 18 is a view for explaining the laser processing method of the embodiment, in which (a) and (b) show respective states where the protective tape is peeled off from the object and where the expandable tape is expanded;

EXPLANATIONS OF NUMERALS OR LETTERS

1 . . . object to be processed; 3 . . . front face; 4 . . . substrate; 4a . . . cross section (side face); 5 . . . line to cut; 7 . . . modified region; 8 . . . cutting start region; 13 . . . molten processed region; 16 . . . laminate part; 25 . . . semiconductor chip (semiconductor apparatus); 71 . . . quality modified region; 71a . . . front-side end part; 71b . . . rear-side end part; CP . . . part where lines to cut intersect; L . . . laser light; M . . . metal film; P . . . light-converging point; RC . . . predetermined part in lines to cut.

BEST MODES FOR CARRYING OUT THE INVENTION

In the following, a preferred embodiment of the present invention will be explained in detail with reference to the drawings. The laser processing method in accordance with this embodiment utilizes a phenomenon of multiphoton absorption in order to form a modified region within an object to be processed. Therefore, a laser processing method for forming a modified region by the multiphoton absorption will be explained first.

A material becomes optically transparent when its absorption bandgap $E_G$ is greater than photon energy hv. Hence, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at a light-converging point. The multiphoton absorption occurs under a condition where the peak power density is 1×10$^8$ (W/cm$^2$) or greater, for example. The peak power density is determined by (energy of laser light at the light-converging point per pulse)/(beam spot cross-sectional area of laser light×pulse width). In the case of continuous waves, the intensity of laser light is determined by the field intensity (W/cm$^2$) of laser light at the light-converging point.

Figure 1:
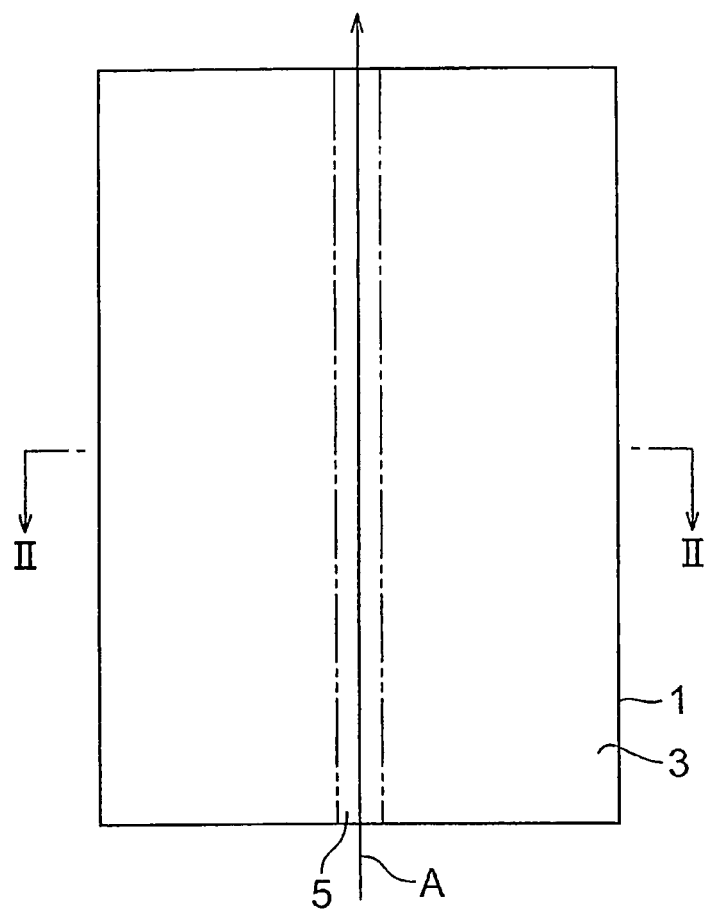
FIG. 1 is a plan view of an object to be processed during laser processing by the laser processing method in accordance with an embodiment.
Figure 2:
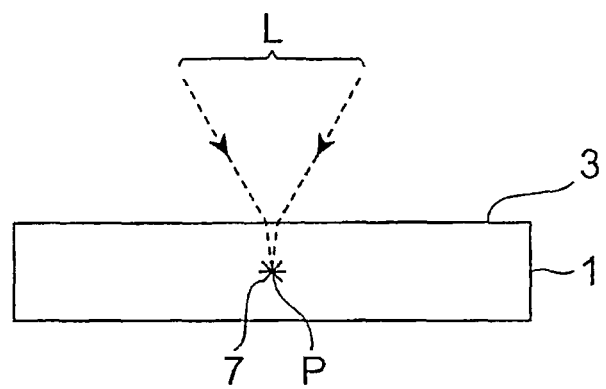
FIG. 2 is a sectional view of the object taken along the line II-II of FIG. 1.

The principle of the laser processing method in accordance with the embodiment using such multiphoton absorption will be explained with reference to FIGS. 1 to 6. As shown in FIG. 1, on a front face 3 of a wafer-like (planar) object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a light-converging point P within the object 1 under a condition generating multiphoton absorption, so as to form a modified region 7. The light-converging point P is a position at which the laser light L is converged. The line to cut 5 may be curved instead of being straight, and may be a line actually drawn on the object 1 without being restricted to virtual lines.

Figure 3:
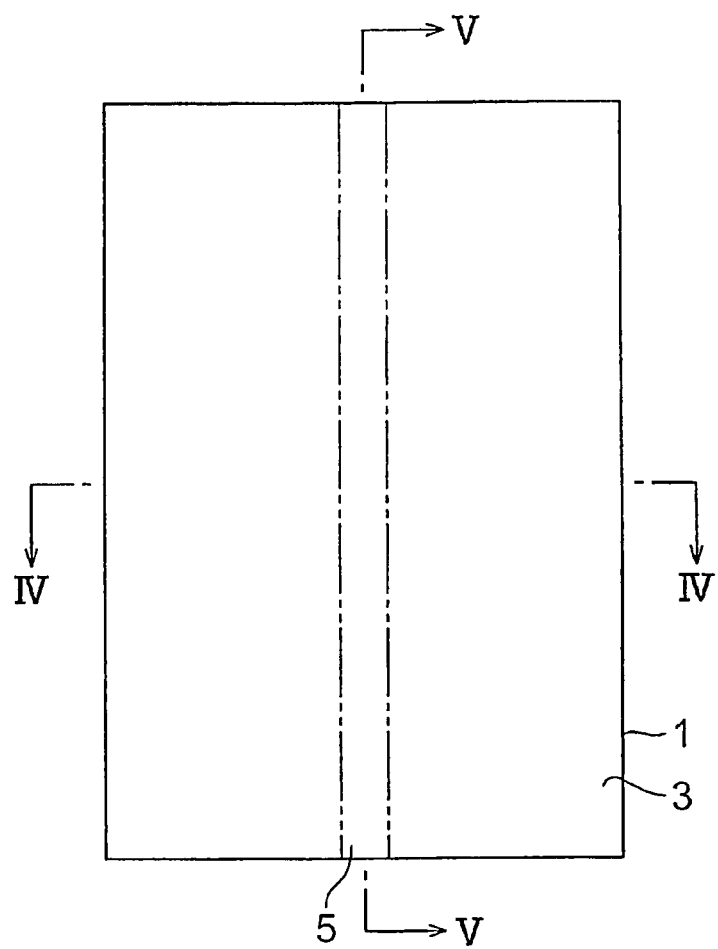
FIG. 3 is a plan view of the object after the laser processing by the laser processing method in accordance with the embodiment.
Figure 4:
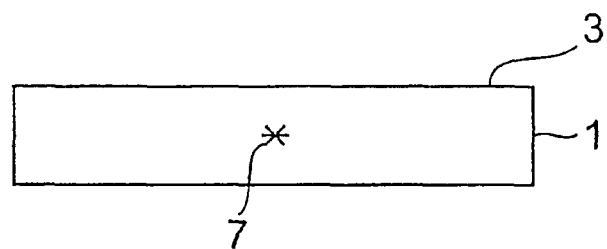
FIG. 4 is a sectional view of the object taken along the line IV-IV of FIG. 3.
Figure 5:
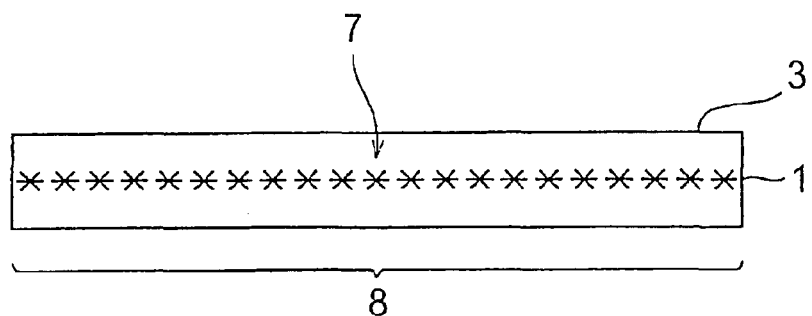
FIG. 5 is a sectional view of the object taken along the line V-V of FIG. 3.

The laser light L is relatively moved along the line to cut 5 (i.e., in the direction of arrow A in FIG. 1), so as to shift the light-converging point P along the line to cut 5. Consequently, as shown in FIGS. 3 to 5, the modified region 7 is formed within the object 1 along the line to cut 5, whereas a cutting start region 8 is formed by the modified region 7. Here, the cutting start region 8 refers to a region which becomes a start point for cutting (fracturing) at the time when the object 1 is cut. The cutting start region 8 may be made by the modified region 7 formed continuously or modified regions 7 formed intermittently.

In the laser processing method in accordance with this embodiment, the modified region 7 is not formed by the heat generated from the object 1 absorbing the laser light L. The laser light L is transmitted through the object 1, so as to generate multiphoton absorption therewithin, thereby forming the modified region 7. Therefore, the front face 3 of the object 1 hardly absorbs the laser light L and does not melt.

Figure 6:
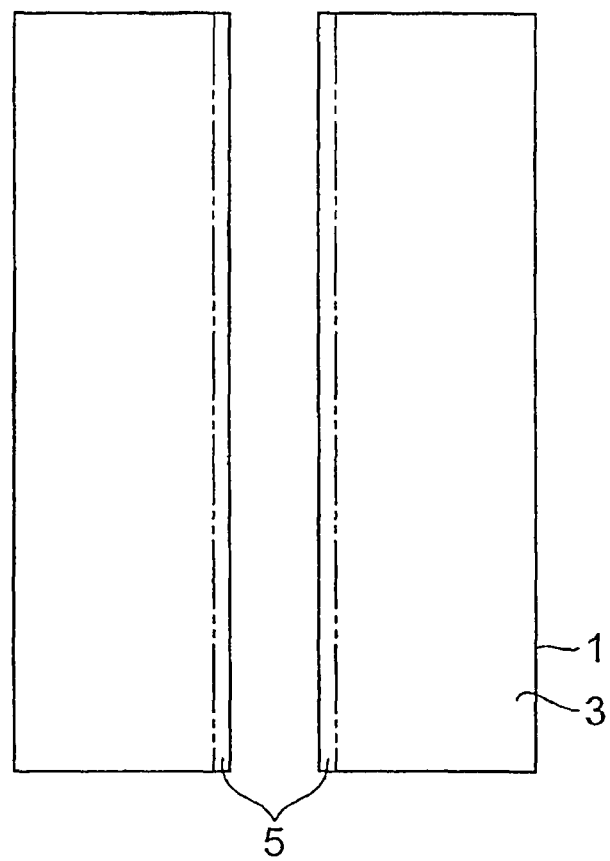
FIG. 6 is a plan view of the object cut by the laser processing method in accordance with the embodiment.

When the cutting start region 8 is formed within the object 1, fractures are likely to start from the cutting start region 8, whereby the object 1 can be cut with a relatively small force as shown in FIG. 6. Therefore, the object 1 can be cut with a high precision without generating unnecessary fractures greatly deviating from the line to cut 5 on the front face 3 of the object 1.

There seem to be the following two ways of cutting the object 1 from the cutting start region 8 acting as the start point. The first case is where an artificial force is applied to the object 1 after forming the cutting start region 8, so that the object 1 fractures from the cutting start region 8, whereby the object 1 is cut. This is the cutting in the case where the object 1 has a large thickness, for example. Applying an artificial force refers to exerting a bending stress or shear stress to the object 1 along the cutting start region 8, or generating a thermal stress by applying a temperature difference to the object 1, for example. The other case is where the forming of the cutting start region 8 causes the object 1 to fracture naturally in its cross-sectional direction (thickness direction) from the cutting start region 8 acting as a start point, thereby cutting the object 1. This becomes possible if the cutting start region is formed by one row of modified region 7 when the object 1 has a small thickness, or if the cutting start region 8 is formed by a plurality of rows of modified regions 7 in the thickness direction when the object 1 has a large thickness. Even in this naturally fracturing case, fractures do not extend onto the front face 3 at a portion corresponding to an area not formed with the cutting start region 8, so that only the portion corresponding to the area formed with the cutting start region 8 can be cleaved, whereby cleavage can be controlled well. Such a cleaving method with a favorable controllability is quite effective, since the object 1 such as silicon wafer has recently been apt to decrease its thickness.

The modified region formed by multiphoton absorption in the laser processing method in accordance with this embodiment encompasses the following cases (1) to (3):

(1) Case Where the Modified Region is a Crack Region Including One Crack or a Plurality of Cracks An object to be processed (e.g., glass or a piezoelectric material made of $LiTaO_3$) is irradiated with laser light while locating a light-converging point therewithin under a condition with a field intensity of at least $1 \times 10^8$ (W/cm$^2$) at the light-converging point and a pulse width of 1 μs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is $1 \times 10^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (December, 1998), pp. 23-28.

The inventors determined the relationship between field intensity and crack size by an experiment. The following are conditions of the experiment.

(A) Object to be Processed: Pyrex (Registered Trademark) Glass (With a Thickness of 700 μm)

(B) Laser light source: semiconductor laser pumping Nd:YAG laser
wavelength: 1064 nm
laser light spot cross-sectional area: $3.14 \times 10^{-8}$ cm$^2$
oscillation mode: Q-switched pulse
repetition frequency: 100 kHz
pulse width: 30 ns
output: output<1 mJ/pulse
laser light quality: TEM$_{00}$
polarizing property: linear polarization (C) Condenser Lens transmittance at a laser light wavelength: 60%

(D) Moving Rate of the Mounting Table Mounting the Object: 100 mm/sec

The laser light quality of TEM$_{00}$ means that the light-converging characteristic is so high that convergence to about the wavelength of laser light is possible.

Figure 7:
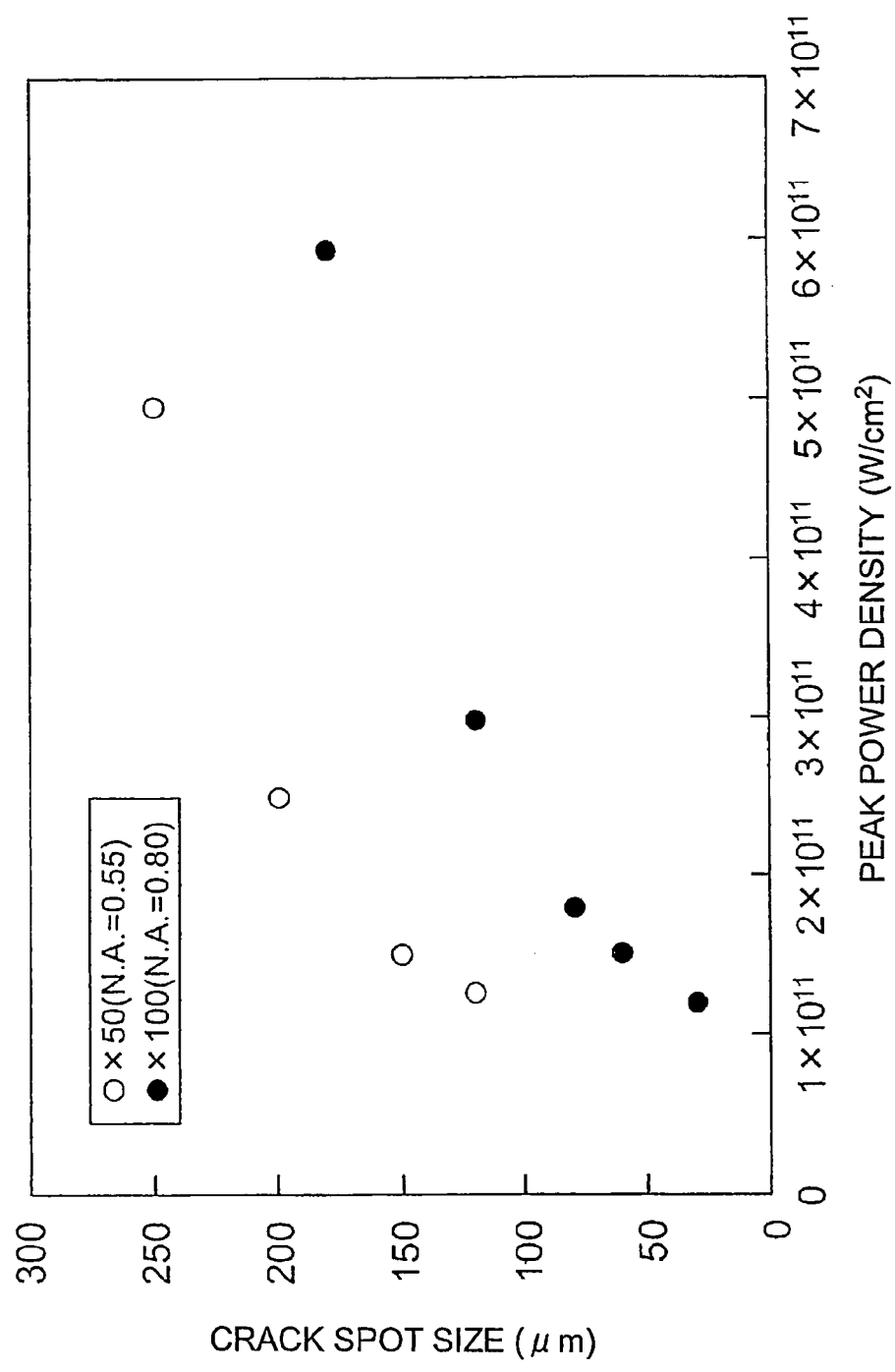
FIG. 7 is a graph showing relationships between the field intensity and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
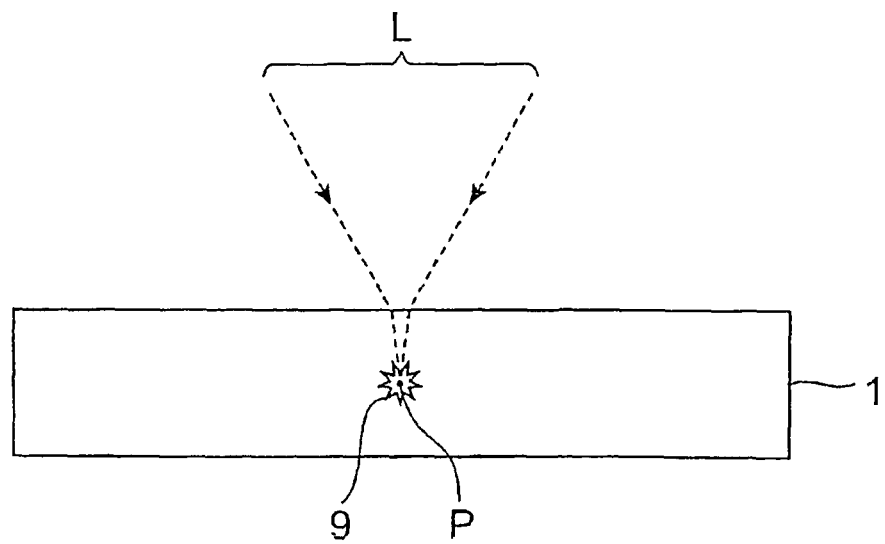
FIG. 8 is a sectional view of the object in a first step of the laser processing method in accordance with the embodiment.
Figure 9:
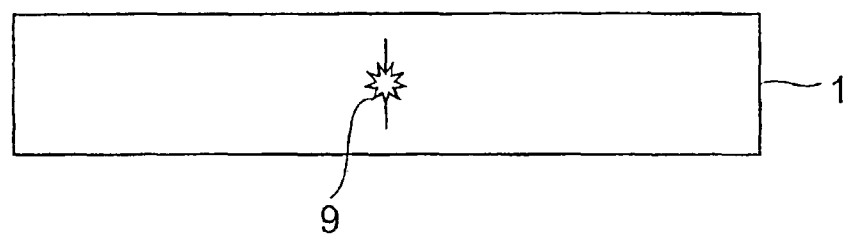
FIG. 9 is a sectional view of the object in a second step of the laser processing method in accordance with the embodiment.
Figure 10:
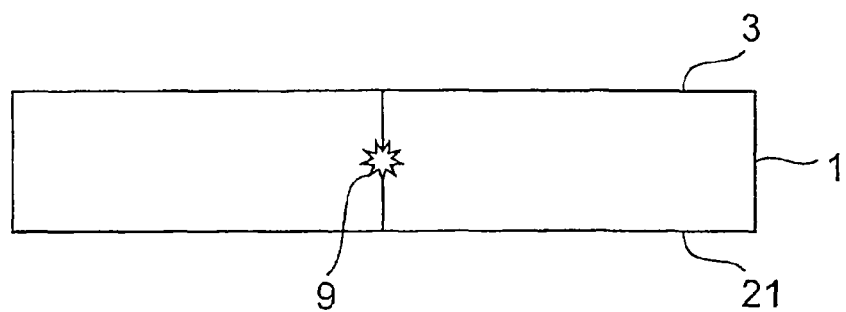
FIG. 10 is a sectional view of the object in a third step of the laser processing method in accordance with the embodiment.
Figure 11:
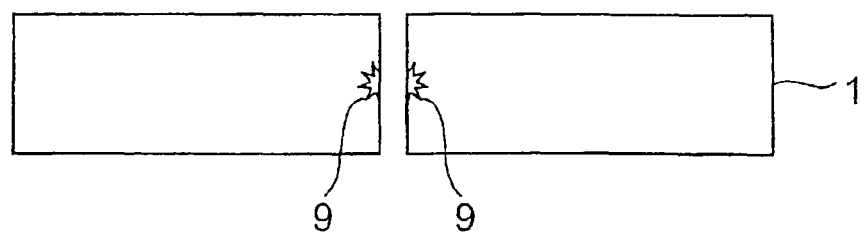
FIG. 11 is a sectional view of the object in a fourth step of the laser processing method in accordance with the embodiment.

A mechanism by which the object to be processed is cut by forming a crack region will now be explained with reference to FIGS. 8 to 11. As shown in FIG. 8, the object 1 is irradiated with laser light L while the light-converging point P is located within the object 1 under a condition where multiphoton absorption occurs, so as to form a crack region 9 therewithin along a line to cut. The crack region 9 is a region containing one crack or a plurality of cracks. Thus formed crack region 9 yields a cutting start region. A crack further grows from the crack region 9 acting as a start point (i.e., from the cutting start region acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case Where the Modified Region is a Molten Processed Region

An object to be processed (e.g., semiconductor material such as silicon) is irradiated with laser light while locating a light-converging point within the object under a condition with a field intensity of at least $1 \times 10^8$ (W/cm$^2$) at the light-converging point and a pulse width of 1 μs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure has changed to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1 \times 10^{12}$ (W/cm$^2$), for example. The pulse width is preferably 1 ns to 200 ns, for example.

By an experiment, the inventors verified that a molten processed region was formed within a silicon wafer. The following are conditions of the experiment.

(A) Object to be Processed: Silicon Wafer (With a Thickness of 350 µm and an Outer Diameter of 4 Inches)

(B) Laser
  light source: semiconductor laser pumping Nd:YAG laser
  wavelength: 1064 nm
  laser light spot cross-sectional area: $3.14 \times 10^{-8}$ cm$^2$
  oscillation mode: Q-switched pulse
  repetition frequency: 100 kHz
  pulse width: 30 ns
  output: 20 µJ/pulse
  laser light quality: TEM$_{00}$
  polarizing property: linear polarization (C) Condenser Lens
  magnification: ×50
  N.A.: 0.55
  transmittance at a laser light wavelength: 60%

(D) Moving Rate of the Mounting Table Mounting the Object: 100 mm/sec

Figure 12:
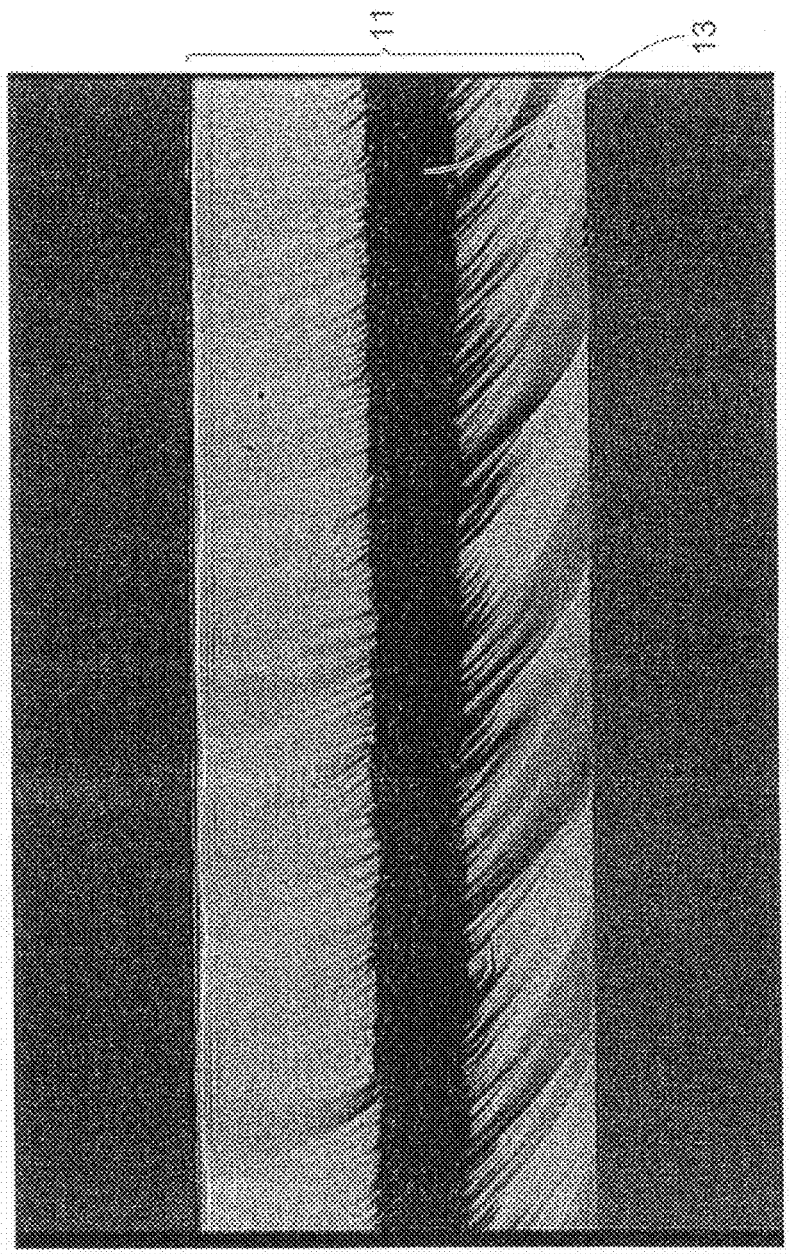
FIG. 12 is a view showing a photograph of a cross section of a part of a silicon wafer cut by the laser processing method in accordance with the embodiment.

FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 µm in the thickness direction.

Figure 13:
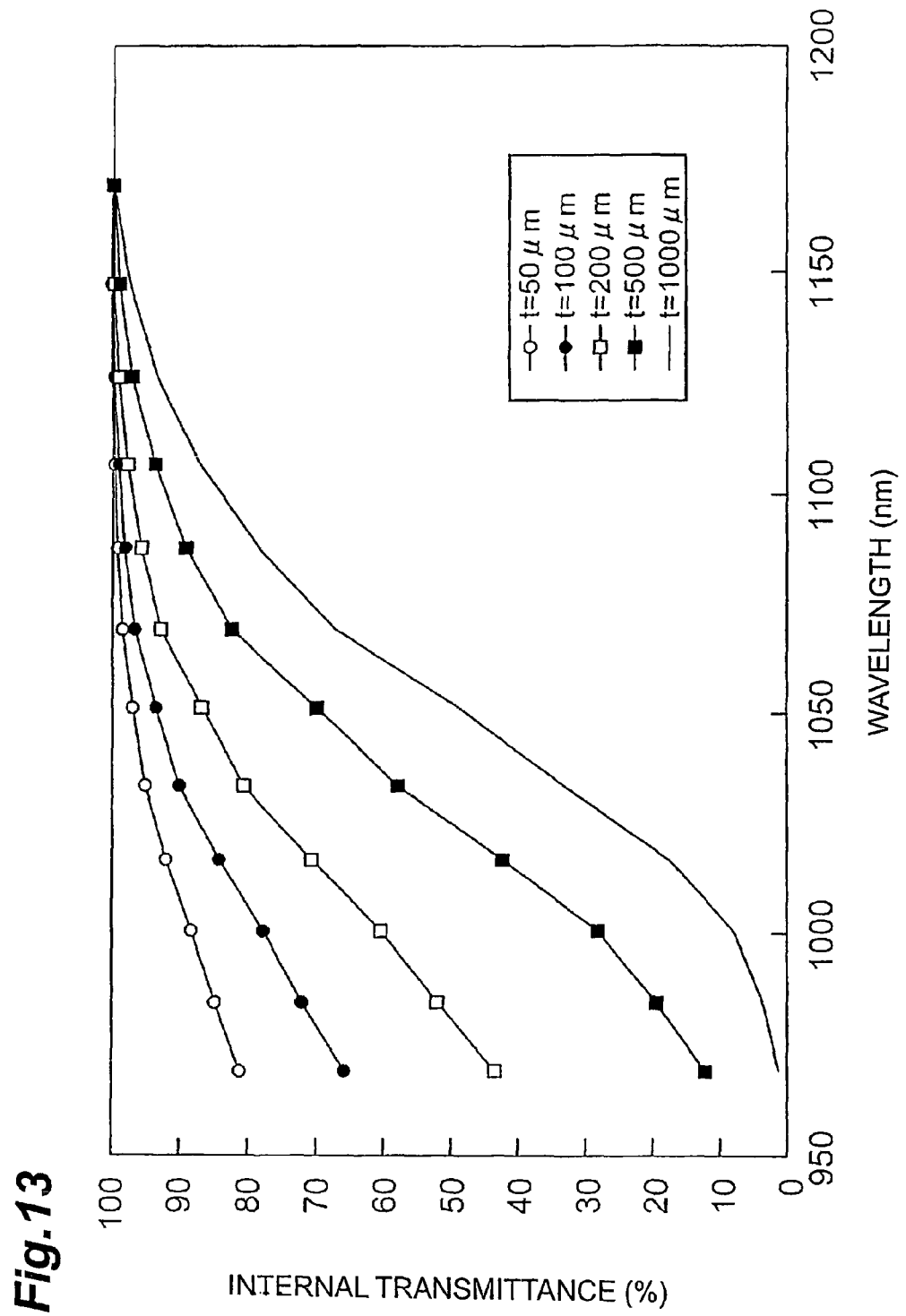
FIG. 13 is a graph showing relationships between the laser light wavelength and the transmittance within the silicon substrate in the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear sides of the silicon substrate are eliminated, so as to show the internal transmittance alone. The respective relationships are shown in the cases where the thickness t of the silicon substrate is 50 µm, 100 µm, 200 µm, 500 µm, and 1000 µm.

For example, at the Nd:YAG laser wavelength of 1064 nm, the laser light appears to be transmitted through the silicon substrate by at least 80% when the silicon substrate has a thickness of 500 µm or less. Since the silicon wafer 11 shown in FIG. 12 has a thickness of 350 µm, the molten processed region 13 caused by multiphoton absorption is formed near the center of the silicon wafer 11, i.e., at a part distanced from the front face by 175 µm. The transmittance in this case is 90% or more with reference to a silicon wafer having a thickness of 200 µm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

A fracture is generated in a silicon wafer from a cutting start region formed by a molten processed region, acting as a start point, toward a cross section, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the cutting start region to the front and rear faces of the silicon wafer encompasses a case where the fracture grows from a state where the molten processed region forming the cutting start region is molten and a case where the fracture grows when the molten processed region forming the cutting start region is re-solidified from the molten state. In either case, the molten processed region is formed only within the silicon wafer, and thus is present only within the cross section after cutting as shown in FIG. 12. When a cutting start region is thus formed within the object by a molten processed region, unnecessary fractures deviating from a cutting start region line are harder to occur at the time of cleaving, whereby cleavage control becomes easier.

(3) Case Where the Modified Region is a Refractive Index Change Region

An object to be processed (e.g., glass) is irradiated with laser light while locating a light-converging point within the object under a condition with a field intensity of at least $1 \times 10^8$ (W/cm$^2$) at the light-converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1 \times 10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November 1997), pp. 105-111.

While the cases (1) to (3) are explained in the foregoing as a modified region formed by multiphoton absorption, a cutting start region may be formed as follows while taking account of the crystal structure of a wafer-like object to be processed, its cleavage characteristic, and so forth, whereby the object can be cut with a high precision by a smaller force from the cutting start region acting as a start point.

Namely, in the case of a substrate made of a monocrystal semiconductor having a diamond structure such as silicon, it will be preferred if a cutting start region is formed in a direction extending along a (111) plane (first cleavage plane) or a (110) plane (second cleavage plane). In the case of a substrate made of a III-V family compound semiconductor of sphalerite structure such as GaAs, it will be preferred if a cutting start region is formed in a direction extending along a (110) plane. In the case of a substrate having a crystal structure of hexagonal system such as sapphire (Al$_2$O$_3$), it will be preferred if a cutting start region is formed in a direction extending along a (1120) plane (A plane) or a (1100) plane (M plane) while using a (0001) plane (C plane) as a principal plane.

When the substrate is formed with an orientation flat in a direction to be formed with the above-mentioned cutting start region (e.g., a direction extending along a (111) plane in a monocrystal silicon substrate) or a direction orthogonal to the direction to be formed with the cutting start region, the cutting start region extending in the direction to be formed therewith can be formed easily and accurately with reference to the orientation flat.

Figure 14:
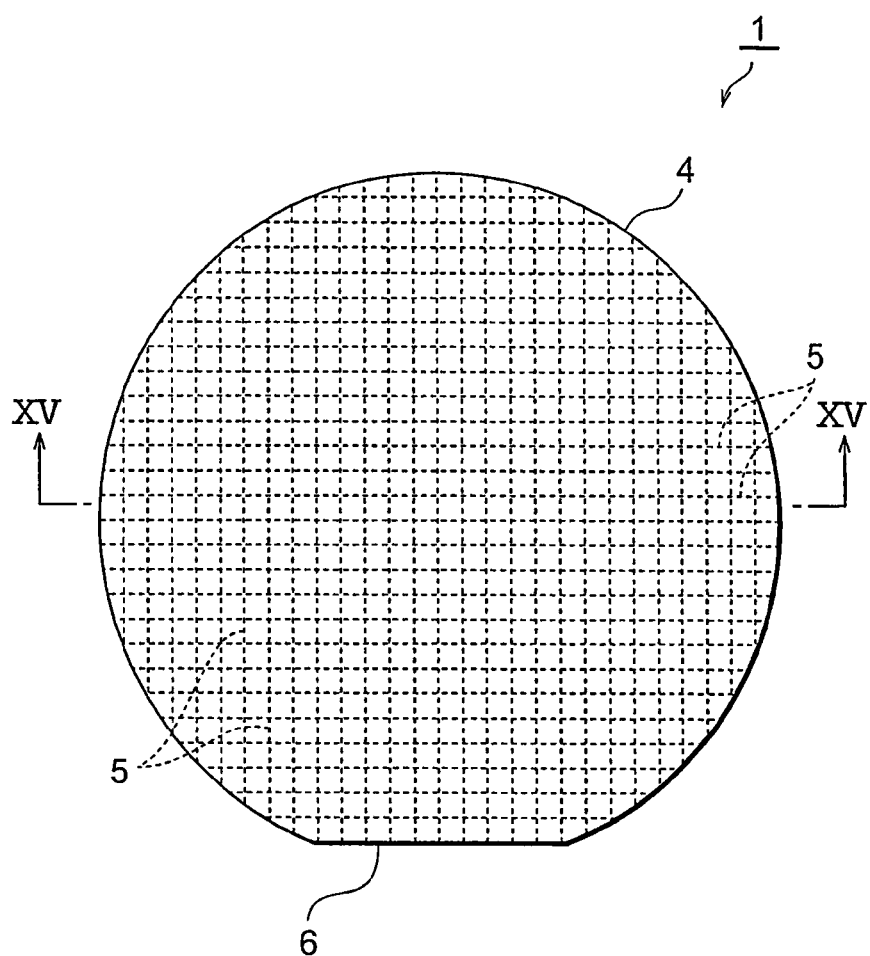
FIG. 14 is a plan view of the object in the laser processing method of the embodiment.

The preferred embodiment of the present invention will now be explained. FIG. 14 is a plan view of an object to be processed in the laser processing method in accordance with this embodiment, whereas FIG. 15 is a partial sectional view of the object taken along the line XV-XV of FIG. 14.

Figure 15:
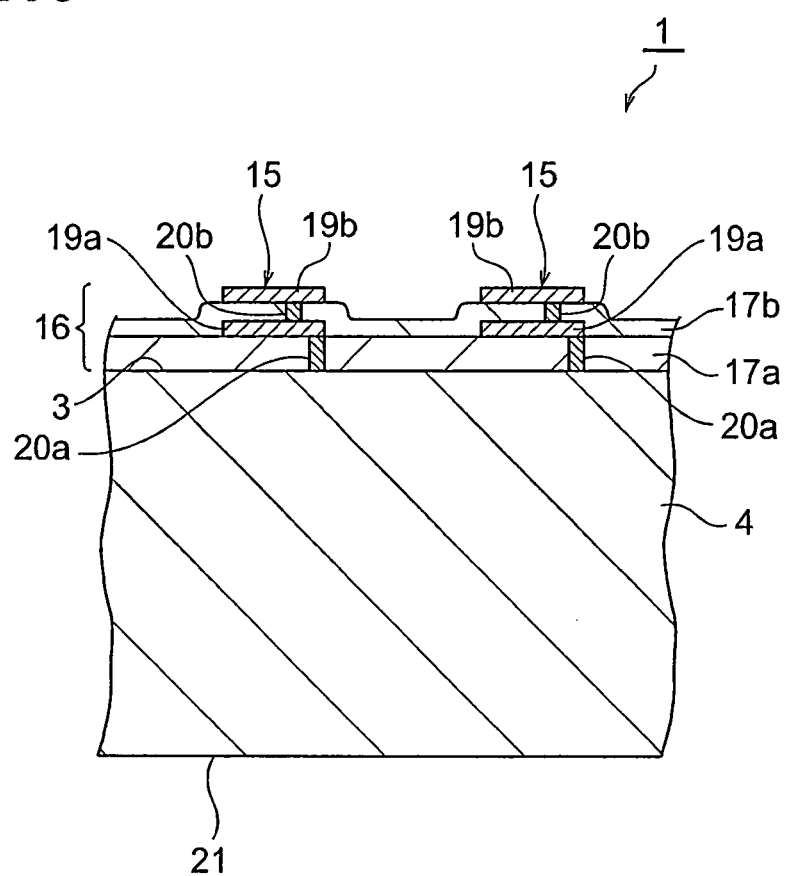
FIG. 15 is a partial sectional view of the object taken along the line XV-XV of FIG. 14.

As shown in FIGS. 14 and 15, the object 1 in this embodiment comprises a substrate 4 having a thickness of 300 μm made of silicon, for example, and a laminate part 16, formed on the front face 3 of the substrate 4, including a plurality of functional devices 15. Each functional device 15 includes an interlayer insulating film 17a laminated on the front face 3 of the substrate 4, a wiring layer 19a disposed on the interlayer insulating film 17a, an interlayer insulating film 17b laminated on the interlayer insulating film 17a so as to cover the wiring layer 19a, and a wiring layer 19b disposed on the interlayer insulating film 17b. The wiring layer 19a and the substrate 4 are electrically connected to each other by a conductive plug 20a penetrating through the interlayer insulating film 17a, whereas the wiring layers 19a and 19b are electrically connected to each other by a conductive plug 20b penetrating through the interlayer insulating film 17b.

Examples of the functional device 15 include semiconductor operating layers formed by crystal growth, light-receiving devices such as photodiodes, light-emitting devices such as laser diodes, circuit devices formed as circuits, and semiconductor devices.

While a number of functional devices 15 are formed like a matrix in directions parallel and perpendicular to an orientation flat 6 in the substrate 4, for example, the interlayer insulating films 17a, 17b are also formed between adjacent functional devices 15, 15 so as to cover the whole front face 3 of the substrate 4.

Figure 16:
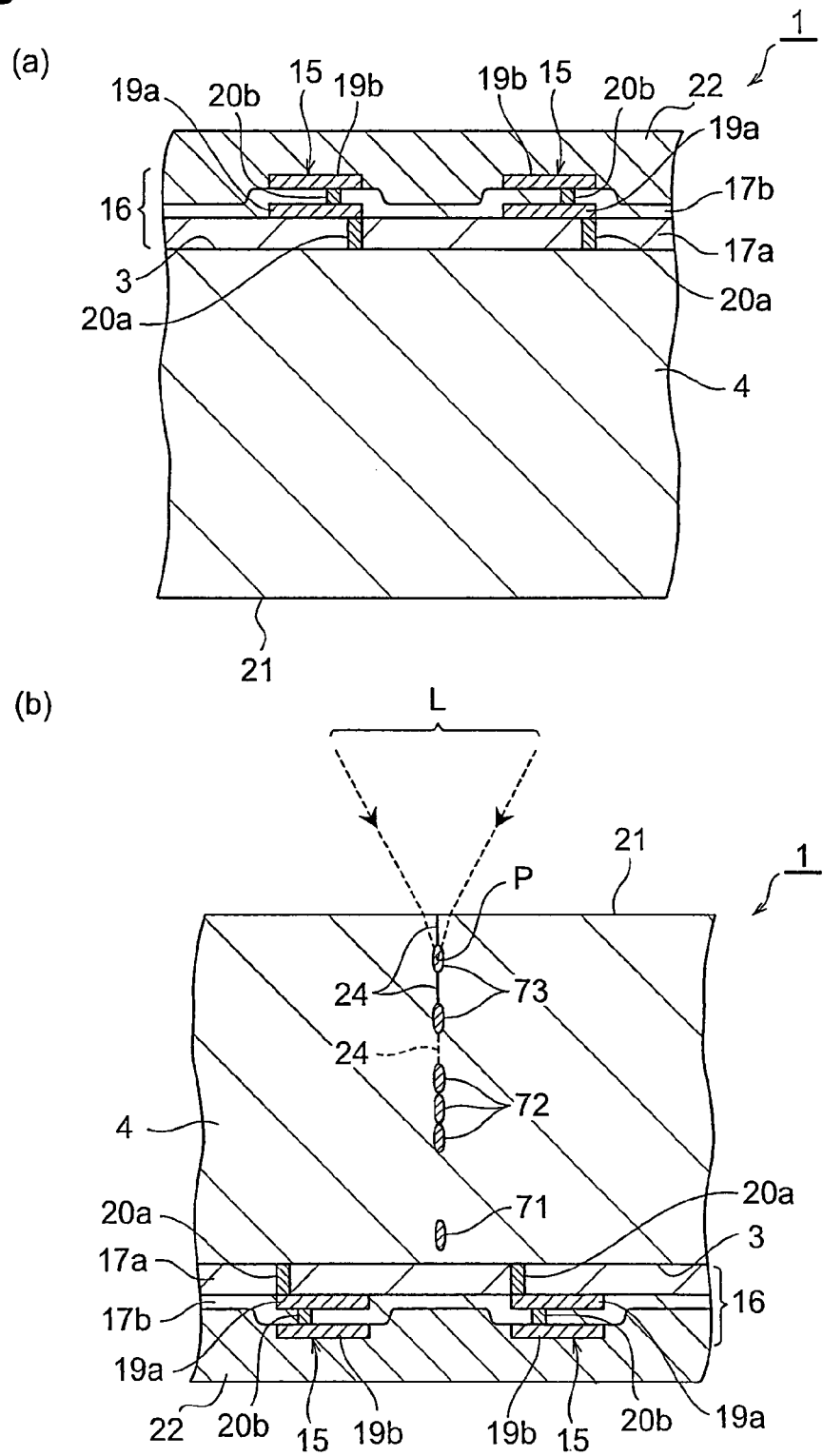
FIG. 16 is a view for explaining the laser processing method of the embodiment, in which (a) and (b) show respective states where a protective tape is attached to the object and where the object is irradiated with laser light.

Thus constructed object 1 is cut into the individual functional devices 15 as follows. First, as shown in FIG. 16(a), a protective tape 22 is attached to the object 1 so as to cover the laminate part 16. Subsequently, as shown in FIG. 16(b), the object 1 is secured onto a mounting table (not depicted) of the laser processing apparatus such that the rear face 21 of the substrate 4 faces up. Here, the protective tape 22 keeps the laminate part 16 from coming into direct contact with the mounting table, whereby each functional device 15 can be protected.

Then, lines to cut 5 are set like a lattice (see broken lines in FIG. 14) so as to pass between adjacent functional devices 15, 15. The substrate 4 is irradiated with laser light L while using the rear face 21 as a laser light entrance face and locating a light-converging point P within the substrate 4 under a condition where multiphoton absorption occurs, whereas the mounting table is moved such that the lines to cut 5 are scanned with the light-converging point P.

While each line to cut 5 is scanned six times with the light-converging point P, the distance from the rear face 21 to the light-converging point P is changed such that one row of quality modified region 71, three rows of divided modified regions 72, and two rows of HC (half cut) modified regions 73, which are successively arranged from the front face 3 side, are formed row by row within the substrate 4 along each line to cut 5. Each of the modified regions 71, 72, 73 becomes a cutting start region when cutting the object 1. Since the substrate 4 in this embodiment is a semiconductor substrate made of silicon, each of the modified regions 71, 72, 73 is a molten processed region. As with the above-mentioned modified region 7, each of the modified regions 71, 72, 73 may be constituted by a continuously formed modified region or modified regions formed intermittently at predetermined intervals.

When the modified regions 71, 72, 73 are formed row by row successively from the side farther from the rear face 21 of the substrate 4, no modified region exists between the rear face 21 acting as the laser light entrance face and the light-converging point P of laser light, whereby the modified regions formed beforehand neither scatter nor absorb the laser light L at the time of forming the modified regions 71, 72, 73, for example. Therefore, the modified regions 71, 72, 73 can be formed accurately within the substrate 4 along the lines to cut 5. When the rear face 21 of the substrate 4 is used as the laser light entrance face, the modified regions 71, 72, 73 can be formed accurately within the substrate 4 along the lines to cut 5 even if a member (e.g., TEG) reflecting the laser light L exists on the lines to cut 5 in the laminate part 16.

Figure 17:
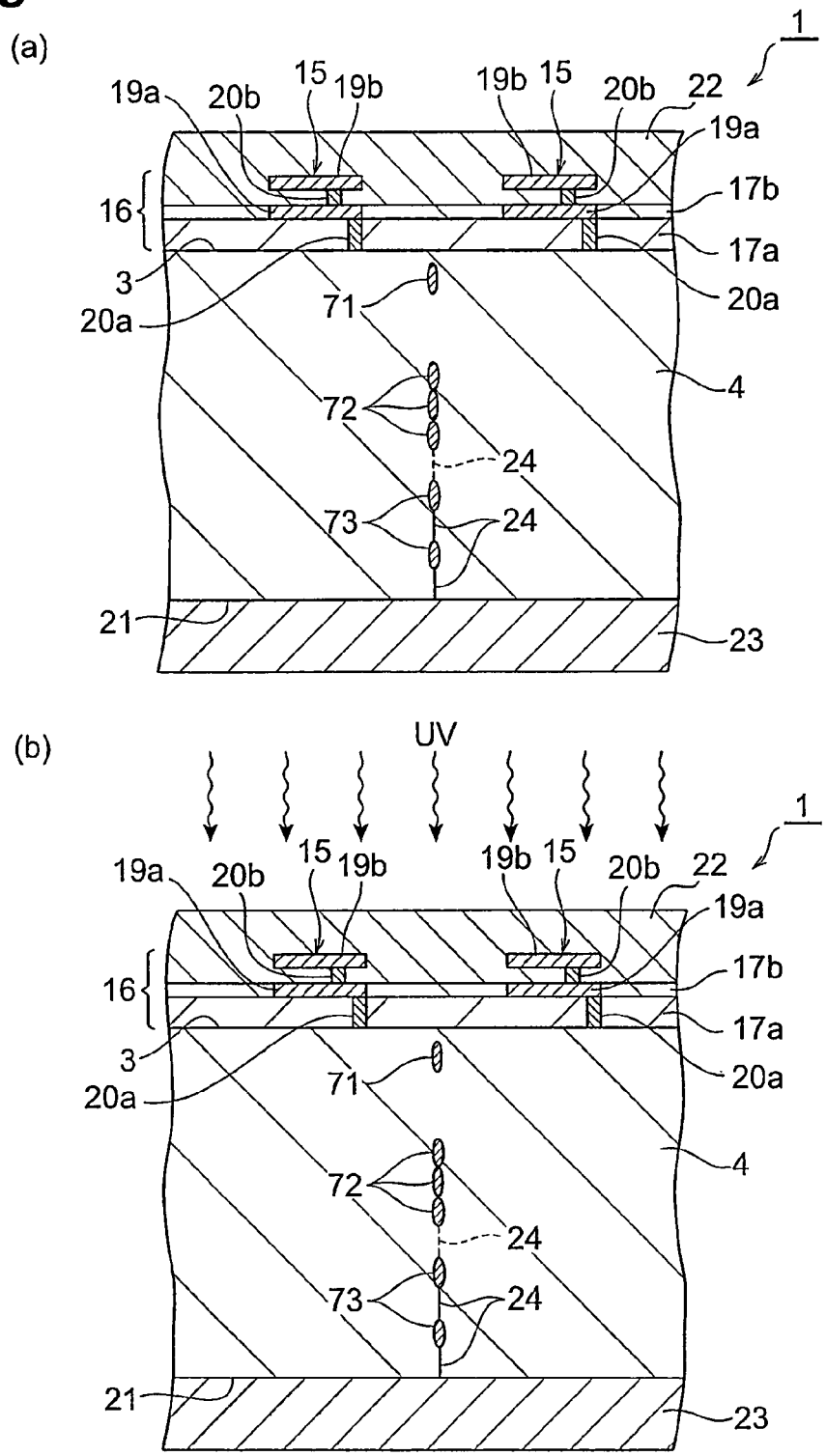
FIG. 17 is a view for explaining the laser processing method of the embodiment, in which (a) and (b) show respective states where an expandable tape is attached to the object and where the protective tape is irradiated with UV rays.

After the modified regions 71, 72, 73 are formed, an expandable tape 23 is attached to the rear face 21 of the substrate 4 in the object 1 as shown in FIG. 17(a). Subsequently, the protective tape 22 is irradiated with UV rays as shown in FIG. 17(b), so as to lower its adhesive force, and the protective tape 22 is peeled off from the laminate part 16 of the object 1 as shown in FIG. 18(a).

After the protective tape 22 is peeled off, the expandable tape 23 is expanded as shown in FIG. 18(b), so as to generate fractures from the modified regions 71, 72, 73 acting as start points, thereby cutting the substrate 4 and laminate part 16 along the lines to cut 5 and separating thus cut semiconductor chips 25 (semiconductor apparatus) from each other.

Figure 19:
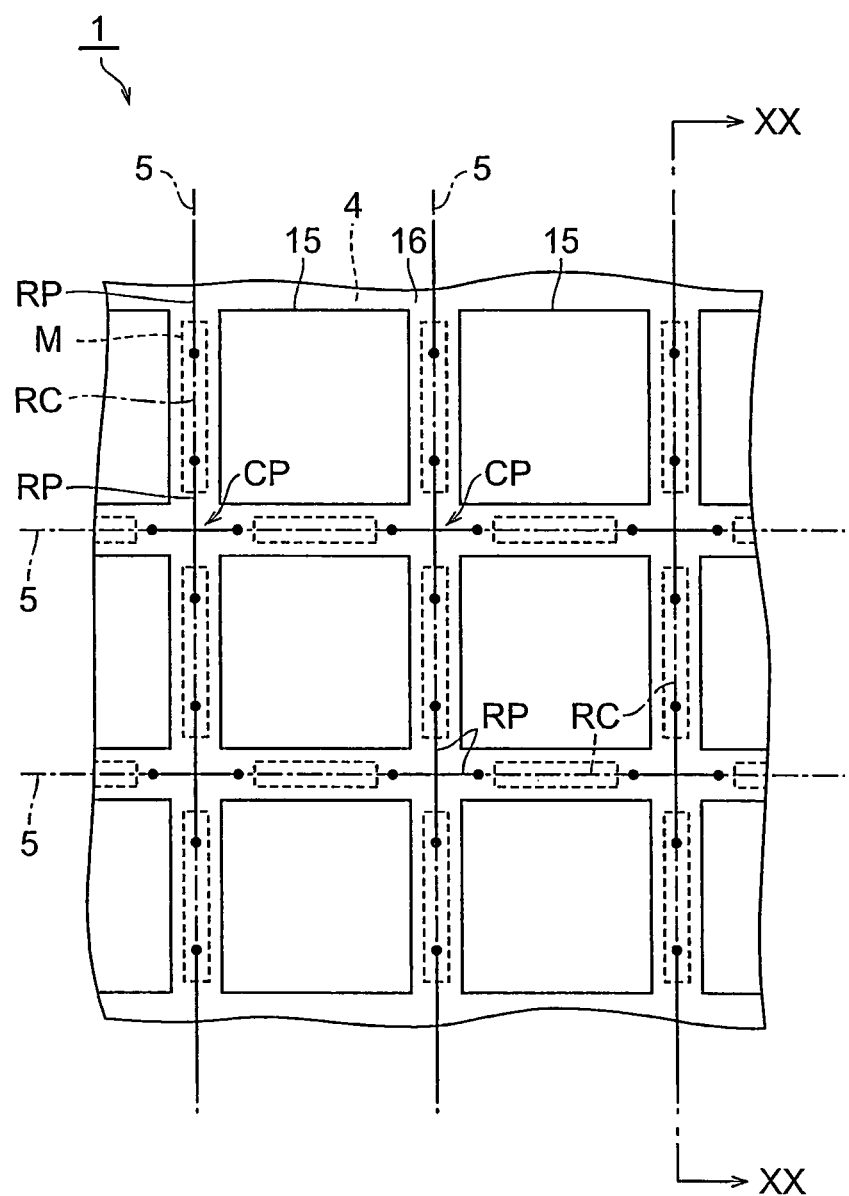
FIG. 19 is a plan view showing a part of the object having a modified region formed by the laser processing method of the embodiment.

A method of forming the modified regions 71, 72, 73 will now be explained in detail. FIG. 19 is a plan view showing a part of the object 1 formed with the modified regions 71, 72, 73, whereas FIG. 20 is a partial sectional view of the object 1 taken along the line XX-XX of FIG. 19.

The quality modified region 71 is formed by selectively switching between continuous oscillation and pulsed oscillation at the time of irradiation with the laser light L. The oscillation of laser light L can be changed by a power controller (not depicted) for regulating the laser light L, for example. Oscillating the laser light L pulsewise can reliably form the quality modified region 71 within the substrate 4, since the energy is higher than in the case continuously oscillating the laser light L and goes over a threshold for processing. Therefore, oscillating the laser light pulsewise along desirable parts RP in the lines to cut 5 and continuously along parts (predetermined parts) RC other than the desirable parts RP can reliably form the quality modified region 71 within the substrate 4 along the desirable parts RP.

Continuously oscillating the laser light L along the predetermined parts RC can also reduce damages imparted to the laminate part 16 by the laser light L as compared with the case oscillating the laser light L pulsewise along the predetermined parts RC, since the energy of the laser light L oscillated continuously is low and does not go over a threshold for processing. Therefore, the accuracy in cutting the laminate part 16 in the predetermined parts RC in the lines to cut 5 can be improved when cutting the substrate 4 and laminate part 16. Hence, as shown in FIG. 18(b), the cut section (side face) 4a of the substrate 4 and the cut section (side face) 16a of the laminate 16 become highly accurate cut sections with suppressed irregularities in the semiconductor chips 25 manufactured by using the laser processing method of this embodiment.

Figure 20:
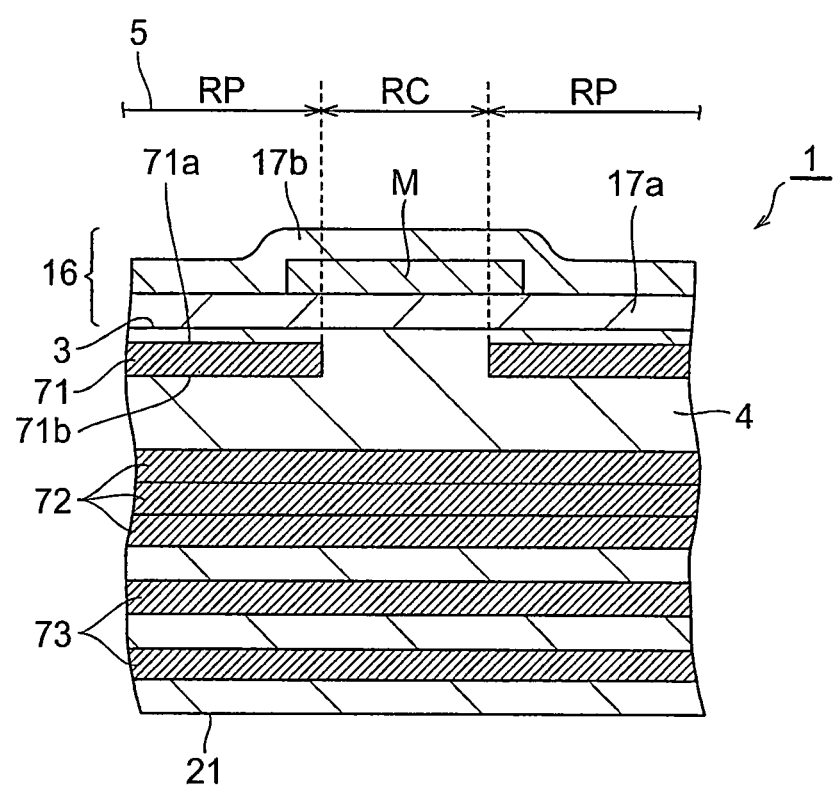
FIG. 20 is a partial sectional view of the object taken along the line XX-XX of FIG. 19.

In this embodiment, as shown in FIGS. 19 and 20, a metal film M is provided within the laminate part 16 along the predetermined parts RC in the lines to cut 5. From the viewpoint of reducing damages to the above-mentioned laminate part 16, it will be preferred if no quality modified region 71 is formed within the substrate 4 along the predetermined parts RC. When the metal film M is provided within the laminate part 16, the laminate part 16 is more likely to be damaged. The following seem to be reasons why such damages occur. Under the influence of aberrations and the like of lenses converging the laser light L, a part of components of the laser light L may be converged by the metal film M. In this case, the laser light L is reflected by the metal film M, so that thus reflected light may form modified regions within the substrate 4 and laminate part 16 or at the interface between the substrate 4 and laminate part 16. In the case where the rear face 21 of the substrate 4 is an entrance face in particular, aberrations of lenses become more influential when forming modified regions on the side farther from the entrance face. Also, modified regions are likely to be formed within the laminate part 16, since the threshold required for forming modified regions is lower in the laminate part 16 than in the substrate 4. However, causes of damages to the laminate part 16 are not restricted to those mentioned above.

Examples of the metal film M include metal wiring and metal pads constituting a test element group (TEG). The metal film M may be a film which peels off upon heating. In place of the metal film M, an insulating film such as low dielectric constant film (low-k film) may be provided within the laminate part 16. The insulating film may be a film which peels off upon heating. An example of the low dielectric constant film is a film having a dielectric constant lower than 3.8 (the dielectric constant of $SiO_2$).

Preferably, as shown in FIG. 19, the laser light L is oscillated pulsewise in parts CP where the lines to cut 5 intersect. This can reliably form the quality modified region 71 within the substrate 4 along the parts CP where the lines to cut 5 intersect. As a consequence, when cutting the substrate 4 and laminate part 16, the lines to cut 5 can prevent chipping and the like from occurring in the parts CP where the lines to cut 5 intersect. Therefore, the accuracy in cutting the substrate 4 and laminate part 16 can further be improved.

Preferably, as shown in FIG. 20, one row of quality modified region 71 is formed at a position where the distance between the front face 3 of the substrate 4 and the front-side end part 71a of the quality modified region 71 is 5 μm to 20 μm, or at a position where the distance between the front face 3 of the substrate 4 and the rear-side end part 71b of the quality modified region 71 is [5+(the thickness of the substrate 4)×0.1] μm to [20+(the thickness of the substrate 4)×0.1] μm. Here, if an expandable tape 23 as an expandable film is attached to the rear face 21 of the substrate 4 and expanded, for example, the substrate 4 and laminate part 16 will be cut along the lines to cut 5. If the modified region 71 is formed at any of the above-mentioned positions, the laminate part 16 (constituted by the interlayer insulating films 17a, 17b here) can be cut with a high precision. Even when the substrate 4 has a large thickness, e.g., 300 μm, the substrate 4 and laminate part 16 can be cut with a high precision.

In the forming of the divided modified regions 72, three rows, for example, of modified regions 72 are formed as a series in the thickness direction of the substrate 4. Further, in the forming of the HC modified regions 73, two rows, for example, of HC modified regions 73 are formed, so as to generate fractures 24 extending along the lines to cut 5 from the HC modified regions 73 to the rear face 21 of the substrate 4. Depending on forming conditions, the fracture 24 may occur between the divided modified region 72 and HC modified region 73 adjacent to each other. When the expandable tape 23 is attached to the rear face 21 of the substrate 4 and expanded, fractures proceed smoothly from the substrate 4 to the laminate part 16 by way of the divided modified regions 72 formed by three rows as series in the thickness direction, whereby the substrate 4 and laminate part 16 can be cut accurately along the lines to cut 5.

The divided modified regions 72 are not restricted to three rows as long as they can smoothly advance fractures from the substrate 4 to the laminate part 16. In general, the number of rows of divided modified regions 72 is reduced as the substrate 4 becomes thinner, and is increased as the substrate 4 becomes thicker. The divided modified regions 72 may be separated from each other as long as they can smoothly advance fractures from the substrate 4 to the laminate part 16. The HC modified region 73 may be one row as long as the fractures 24 can reliably be generated from the HC modified region 73 to the rear face 21 of the substrate 4.

Though a preferred embodiment of the present invention is explained in detail in the foregoing, the present invention is not limited to the above-mentioned embodiment.

For example, though the above-mentioned embodiment selectively switches between pulsed oscillation and continuous oscillation when forming the quality modified regions 71, the pulsed oscillation and continuous oscillation may selectively be switched therebetween when forming other modified regions. Examples of the other modified regions include divided modified regions 72 and HC modified regions 73. Among them, from the viewpoint of improving the accuracy in cutting, it will be preferred if the pulsed oscillation and continuous oscillation may selectively be switched therebetween when forming the quality modified region 71 positioned closest to the device.

The object 1 may be a GaAs wafer or a silicon wafer having a thickness of 100 μm or less. In these cases, forming one row of modified region within the object 1 along the lines to cut 5 can cut the object 1 with a sufficiently high precision.

The modified regions 71, 72, 73 are not limited to those formed by the multiphoton absorption generated within the object 1. The modified regions 71, 72, 73 may also be formed by generating optical absorption equivalent to the multiphoton absorption within the object 1.

Though a semiconductor wafer made of silicon is used as the object 1 in this embodiment, the material of the semiconductor wafer is not limited thereto. Examples of the semiconductor wafer material include group IV element semiconductors other than silicon, compound semiconductors containing group IV elements such as SiC, compound semiconductors containing group III-V elements, compound semiconductors containing group II-VI elements, and semiconductors doped with various dopants (impurities).

Figure 21:
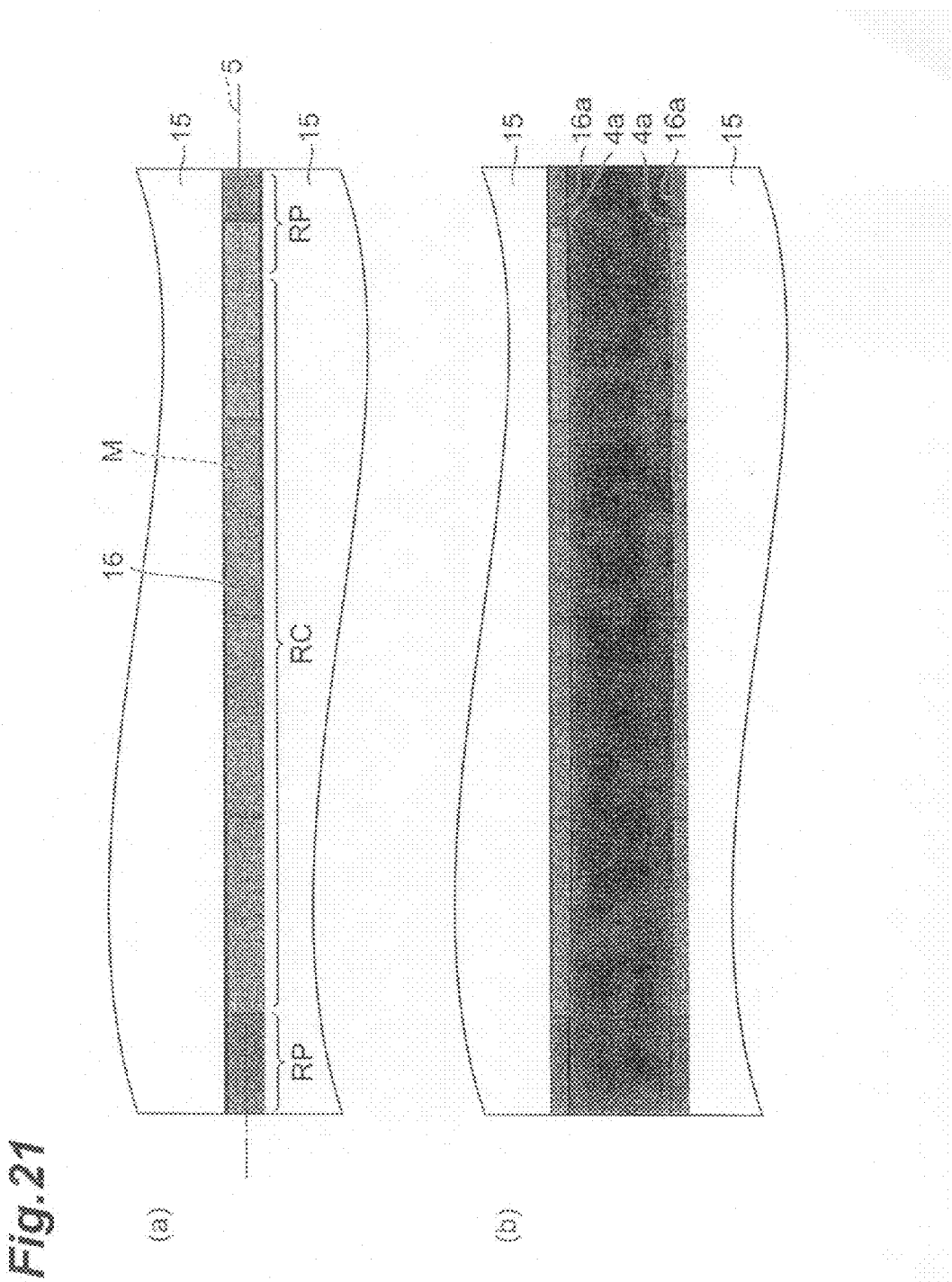
FIG. 21 is a plan view of the object in an example of the laser processing method in accordance with the embodiment, in which (a) and (b) show respective states after the modified region is formed within the object and after the object is cut.
Figure 22:
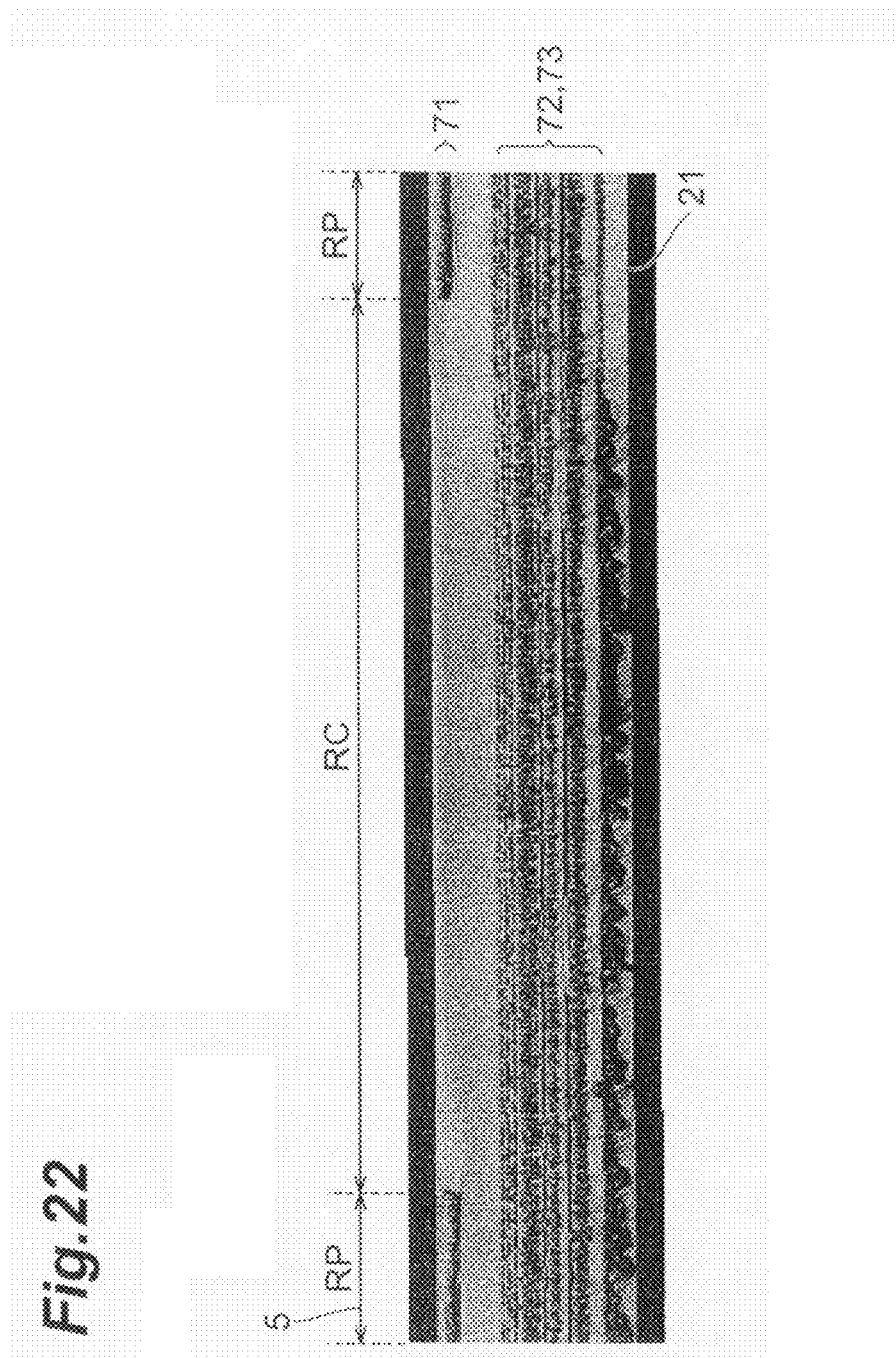
FIG. 22 is a view showing a photograph of a cut section of the object cut by the example of the laser processing method in accordance with the embodiment.

An example of the laser processing method in accordance with the embodiment will now be explained in detail, though the present invention is not limited to this example. FIGS. 21(a) and 21(b) are plan views of an object to be processed in the laser processing method in accordance with this example. FIG. 22 is a view showing a photograph of the cut section 4a of the substrate in the object shown in FIG. 21(b), while corresponding to FIG. 20.

First, the laser light L is oscillated pulsewise along desirable parts RP in a line to cut 5 positioned between functional devices 15, 15, so as to form a quality modified region 71 within the object. On the other hand, the laser light L is continuously oscillated along a predetermined part RC in the lines to cut 5, whereby no quality modified region 71 is formed within the object. Here, the rear face 21 of the substrate is the laser light entrance face. Next, divided modified regions 72 and HC modified regions 73 are formed along the line to cut 5. As a result, though a metal film M is included in the laminate part 16 extending along the predetermined part RC in the line to cut 5, no damages to the laminate part 16 caused by laser light are seen as shown in FIG. 21(a).

After the modified regions 71, 72, 73 are formed, an expandable tape is attached to the object and is expanded by an expander, so as to cut the object (see FIG. 21(b)). As shown in FIG. 21(b), the cut section 16a is seen to have been cut with a high precision without irregularities. A photograph taking the cut section 4a of the substrate in thus cut object is shown as a drawing in FIG. 22. As shown in FIG. 22, no quality modified region is formed within the object along the predetermined part RC in the line to cut 5.

Laser processing conditions for forming the modified regions 71, 72, 73 will now be explained. The pulse width of laser light L is 180 ns. The interval between irradiating positions of laser light L (pulse pitch) is 4 μm. The frequency of laser light L is 75 kHz. The 15 relationship among the distance from the rear face 21 to become the entrance face 21 to the light-converging point P (light-converging point position), the energy of laser light L, and the unit time energy is as shown in Table 1.

TABLE 1

|  | Light-converging point position (μm) | Energy (μJ) | Unit time Energy (W) |
|---|---|---|---|
| Quality modified region 71 | 290 | 9.5 | 0.71 |
| Divided modified region 72 | 180 | 15 | 1.13 |
| Divided modified region 72 | 144 | 15 | 1.13 |
| HC modified region 73 | 85 | 5 | 0.38 |
| HC modified region 73 | 46 | 5 | 0.38 |

Figure 23:
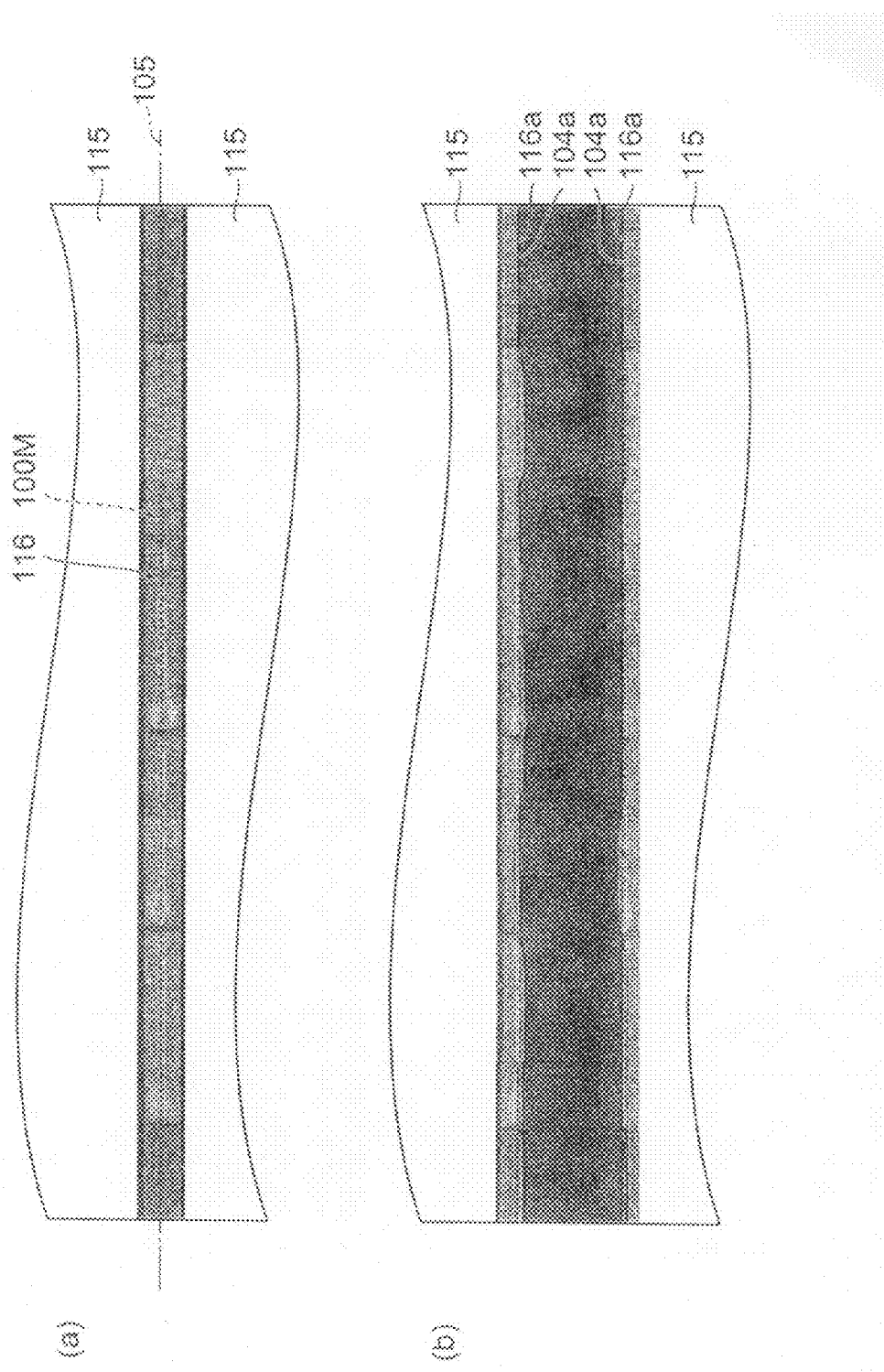
FIG. 23 is a plan view of the object in an example of laser processing method, in which (a) and (b) show respective states after the modified region is formed within the object and after the object is cut.
Figure 24:
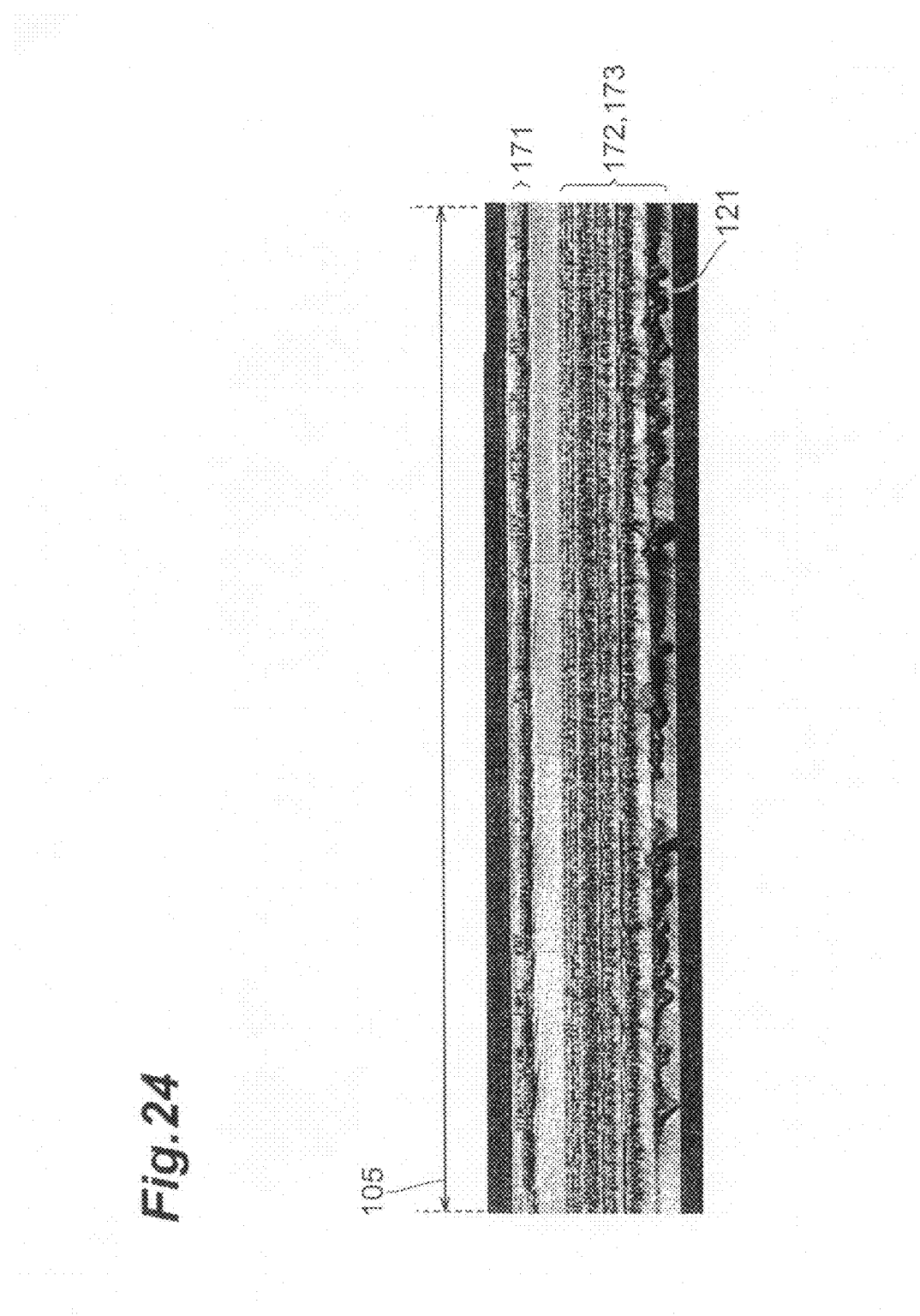
FIG. 24 is a view showing a photograph of a cut section of the object in the example of laser processing method.

On the other hand, FIGS. 23(a) and 23(b) are plan views of the object in an example of laser processing method. FIG. 24 is a view showing a photograph of a cut section 104a of the substrate in the object shown in FIG. 23(b).

First, a line to cut 105 positioned between functional devices 115, 115 is irradiated with laser light, so as to form modified regions 171, 172, 173 within the object. Here, the rear face 121 of the substrate is the laser light entrance face. Since the line to cut 105 is irradiated with the laser light, damages such as peeling of the film occur in a laminate part 116 containing a metal film 100M in this case as shown in FIG. 23(a).

After the modified regions 171, 172, 173 are formed, an expandable tape is attached to the object and is expanded by an expander, so as to cut the object (see FIG. 23(b)). As shown in FIG. 23(b), irregularities are seen in a cut section 116a, thus verifying that the accuracy in cutting is insufficient. A photograph taking the cut section 104a of the substrate in thus cut object is shown as a drawing in FIG. 24. As shown in FIG. 24, a modified region 171 is formed within the object along the line to cut 105.

Industrial Applicability

The present invention can reliably form a modified region within an object to be processed along a desirable part in a line to cut.

The invention claimed is:

1. A laser processing method comprising the steps of:
    irradiating a planar object to be processed with laser light while locating a light-converging point within the object so as to form a modified region functioning as a starting point region for cutting within the object along a cutting line in order to cut the object; and
    cutting the object along the cutting line after forming the modified region,
    wherein, in the step of irradiating the object with the laser light, the laser light is selectively switched between being continuously oscillated during a period of continuous oscillation and being oscillated pulsewise during a period of pulse oscillation, such that the laser light is oscillated pulsewise when irradiating a first part of the object along the cutting line, thereby forming the modified region in the first part of the object along the cutting line, and the laser light is continuously oscillated when irradiating a second part of the object along the cutting line, such that the modified region is not formed in the second part of the object, and
    wherein, in the step of cutting the object, the object is cut by generating at least one fracture extending from the modified region, and the first and the second parts of the object are cut along cutting line.

2. A laser processing method according to claim 1, wherein the laser light is oscillated pulsewise where cutting lines intersect.

3. A laser processing method according to claim 1, wherein the object is a substrate having a front face formed with a laminate part; and
    wherein the modified region is formed within the substrate.

4. A laser processing method according to claim 3, wherein the modified region is formed at a position where the distance between the front face and an end part on the rear face side of the modified region is [5+(substrate thickness)×0.1] μm to [20+(substrate thickness)×0.1] μm.

5. A laser processing method according to claim 3, wherein, when the laminate part includes a metal film or insulating film in a predetermined part along the cutting line, the laser light is continuously oscillated when irradiating the predetermined part.

6. A laser processing method according to claim 3, wherein the modified region is formed at a position where a distance between the front face and an end part on the front face side of the modified region is 5 μm to 20 μm.

7. A laser processing method comprising the steps of:
    irradiating an object to be processed, the object having a substrate and a laminate part formed on a surface of the substrate and including a metal film and an insulating film, the metal film not located on a first part of the object and is located on a second part of the object with reference to a horizontal expansion of the object, with laser light so as to form a modified region functioning as a starting point region for cutting within the substrate along a cutting line in order to cut the object, the metal film arranged to cover the cutting line as viewed in a thickness direction of the object; and
    cutting the object along the cutting line after forming the modified region;
    wherein a first modified region is formed as the modified region in the first part of the object along the cutting line, and the first modified region is not formed in the second part of the object along the cutting line, and
    wherein in the step of cutting the object, the object is cut along the cutting line by generating at least one fracture extending from the modified region.

8. A laser processing method according to claim 7, wherein the first modified region is positioned nearest to the laminate part out of a plurality of rows of the modified region when a plurality of rows of modified region is formed in the thickness direction of the object along the cutting line; and
    wherein a second modified region is formed in the first and the second parts of the object when the second modified region is formed further than the first modified region from the laminate part out of the plurality of rows of the modified region.

9. A laser processing method according to claim 8, wherein, when the first modified region is formed, the energy of the laser light is set to be over a predetermined threshold in order to form the first modified region in the first part, and the energy of the laser light is set to be less than the predetermined threshold so that the first modified region is not formed in the second part of the object; and wherein, when the second modified region is formed, the energy of the laser light is set to be over the predetermined threshold in order to form the second modified region in the first and the second parts.

10. A laser processing method according to one of claims 7 to 9, wherein the object is cut along the cutting line by applying stress to the object after forming the modified region.

11. A method of manufacturing a semiconductor device, comprising the steps of:

irradiating an object to be processed, the object having a substrate and a laminate part formed on a surface of the substrate, the laminate part comprising a plurality of functional devices and a metal film and an insulating film, the metal film not located on a first part of the object, and is located on a second part of the object with reference to a horizontal expansion of the object, with laser light so as to form a modified region functioning as a starting point region for cutting within the semiconductor substrate along a cutting line in order to cut the object, the metal film arranged to cover the cutting line as viewed in a thickness direction of the object; and cutting the object into the functional devices along the cutting line after forming the modified region so as to manufacture the semiconductor device;

wherein a first modified region is formed as the modified region in the first part of the object along the cutting line, and the first modified region is not formed in the second part of the object along the cutting line, and wherein, in the step of cutting the object, the object is cut along the cutting line by generating at least one fracture extending from the modified region.

12. A method according to claim 11, wherein the first modified region is positioned nearest to the laminate part out of a plurality of rows of the modified region when a plurality of rows of modified region is formed in the thickness direction of the object along the cutting line; and wherein a second modified region is formed in the first and the second parts of the object when the second modified region is formed further than the first modified region from the laminate part out of the plurality of rows of the modified region.

13. A method according to claim 12, wherein, when the first modified region is formed, the energy of the laser light is set to be over a predetermined threshold in order to form the first modified region in the first part, and the energy of the laser light is set to be less than the predetermined threshold so that the first modified region is not formed in the second part of the object; and wherein, when the second modified region is formed, the energy of the laser light is set to be over the predetermined threshold in order to form the second modified region in the first and the second parts.

14. A method according to one of claims 11 to 13, wherein the object is cut along the cutting line by applying stress to the object after forming the modified region.

* * * * *

UNITED STATES PATENT AND TRADEMARK OFFICE
CERTIFICATE OF CORRECTION

PATENT NO. : 8,604,383 B2
APPLICATION NO. : 11/659376
DATED : December 10, 2013
INVENTOR(S) : Kuno et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1826 days.

Signed and Sealed this
Twenty-second Day of September, 2015

Michelle K. Lee
*Director of the United States Patent and Trademark Office*